United States Patent
Sogard

(10) Patent No.: US 7,554,648 B2
(45) Date of Patent: Jun. 30, 2009

(54) BLIND DEVICES AND METHODS FOR PROVIDING CONTINUOUS THERMOPHORETIC PROTECTION OF LITHOGRAPHIC RETICLE

(75) Inventor: Michael R. Sogard, Menlo Park, CA (US)

(73) Assignee: Nikon Corporation, Tokyo (JP)

( * ) Notice: Subject to any disclaimer, the term of this patent is extended or adjusted under 35 U.S.C. 154(b) by 564 days.

(21) Appl. No.: 11/266,839

(22) Filed: Nov. 4, 2005

(65) Prior Publication Data
US 2007/0103656 A1   May 10, 2007

(51) Int. Cl.
G03B 27/32   (2006.01)
G03B 27/54   (2006.01)

(52) U.S. Cl. .............................. 355/30; 355/53; 355/67; 355/71; 378/34; 250/492.2

(58) Field of Classification Search .................... 355/30, 355/53, 67; 378/34, 35; 250/492.2
See application file for complete search history.

(56) References Cited

U.S. PATENT DOCUMENTS 6,153,044 A   11/2000   Klebanoff et al.
6,253,464 B1   7/2001   Klebanoff et al.
7,030,959 B2   4/2006   Sogard

OTHER PUBLICATIONS

Rader et al., "Verification Studies of Thermophoretic Protection for EUV Masks," *Proceedings SPIE* 4688:182-193, 2002.

*Primary Examiner*—Della J. Rutledge
(74) *Attorney, Agent, or Firm*—Klarquist Sparkman, LLP

(57) ABSTRACT

Blind devices and related methods for lithography systems are described. An exemplary system has a vacuum chamber with first and second chamber portions. In a member between the chambers is defined an exposure aperture, relative to which a reticle stage in the first chamber portion moves a reticle. A gas enters the first chamber portion and establishes a thermophoretic condition relative to the reticle or portion thereof. A fixed-blind-aperture assembly, movable relative to the exposure aperture and the reticle to exposure and non-exposure positions, defines an illumination aperture through which light from the second chamber portion and gas from the first chamber portion pass when the fixed-blind-aperture assembly is in the exposure position. A gas-passage aperture in the member conducts the gas, passing through the illumination aperture, from the first chamber portion to the second chamber portion when the fixed-blind-aperture assembly is in the non-exposure position.

48 Claims, 13 Drawing Sheets
(5 of 13 Drawing Sheet(s) Filed in Color)

US 7,554,648 B2

BLIND DEVICES AND METHODS FOR PROVIDING CONTINUOUS THERMOPHORETIC PROTECTION OF LITHOGRAPHIC RETICLE

FIELD

This disclosure pertains to microlithography, which is a key imaging and pattern-transfer technology employed in the fabrication of semiconductor devices such as integrated circuits, displays, and the like. More specifically, the disclosure pertains to microlithography in which extreme ultraviolet (EUV) light is used for transferring a pattern from a pattern-defining reticle to an exposure-sensitive substrate such as a semiconductor wafer. Even more specifically, the disclosure pertains to blind devices and methods for preventing particulate contamination of the reticle.

BACKGROUND

Extreme-ultraviolet lithography (EUVL) is currently regarded as a candidate "next generation lithography" (NGL) that offers prospects of substantially finer pattern resolution than currently obtainable using conventional "optical" lithography (i.e., lithography performed using deep-ultraviolet wavelengths of light). These expectations of increased resolution from EUVL stem largely from the fact that, whereas current optical lithography is performed using a wavelength in the range of 150-250 nm, EUVL is performed using a wavelength in the range of 11-15 nm, which is at least ten times shorter than the conventional "optical" wavelengths. Generally, the shorter the wavelength of light used for pattern imaging in microlithography, the finer the obtainable resolution.

In view of the extremely small pattern elements (currently less than 100 nm) that can be resolved using microlithography, including EUVL, the accuracy and precision with which pattern transfer is performed lithographically must be extremely high to ensure proper placement and registration of multiple pattern layers on a substrate and to ensure that the pattern elements are transferred to the substrate with high fidelity. To obtain such high accuracy and precision, extreme measures are taken to control and remove extraneous causes of performance degradation. For example, with current expectations being demanded of microlithography systems to produce pattern features of less than 100 nm, eliminating significant particulate contamination has become paramount.

EUV light is highly attenuated by the atmosphere, and no currently known materials are adequately transmissive and refractive to EUV light for use as EUV lenses. Consequently, EUVL must be performed under partial vacuum conditions using reflective optics (mirrors) for illumination of the reticle and for projection of the illuminated pattern from the reticle to the substrate. Even the reticle is reflective rather than being a transmissive reticle as used in conventional optical microlithography.

In optical microlithography the reticle during use typically is protected by a pellicle from particulate contamination. (The pellicle is a transmissive thin film on a frame that covers the patterned surface of the reticle to prevent deposition of particles on the reticle surface.) A pellicle cannot be used with a reticle for EUVL because, in view of the lack of EUV-transmissive materials, the pellicle would absorb and thus block the EUV beam incident to the reticle, leaving substantially no EUV light for projecting the pattern image to the substrate. Thus, the EUVL reticle must be used naked, which leaves the reticle vulnerable to particulate contamination during use. In optical lithography in which the reticle is protected by a pellicle, a particle deposited on the pellicle is sufficiently displaced from the plane of the reticle (i.e., outside the depth of focus) to be unresolved (or at most poorly resolved) on the wafer. A particle on a naked EUVL reticle, on the other hand, is in the plane of the reticle pattern and hence is resolved on the wafer where it likely will flaw the projected pattern image. Hence, for EUVL reticles, particle protection as effective as a pellicle is required.

In EUVL systems currently under development, the reticle is used facing downward, which is helpful in preventing deposition of particles on the reticle surface. However, merely facing the reticle downward is insufficient for keeping the reticle completely clean, and various techniques currently are being developed that are aimed at preventing deposition of any particulate contamination on the reticle without having to use a pellicle. One technique that exhibited remarkable success in preventing particulate deposition on the reticle (by preventing particles from hitting the reticle) is termed "thermophoresis," discussed in Rader et al, "Verification Studies of Thermophoretic Protection for EUV Masks," *Proceedings SPIE* 4688:182-193, 2002. See also U.S. Pat. Nos. 6,153,044 and 6,253,464. Thermophoresis refers to a force exerted on particles suspended in a gas where a temperature gradient is present, wherein the particles are driven by a thermophoretic "force" (imparted by the gas) from a warmer region to a cooler region. Thus, a surface can be protected from particle deposition by maintaining the surface at a warmer temperature than its surroundings.

General principles of thermophoresis as applied in an EUVL system are described with reference to FIG. 9, which depicts a reticle 222 and a nearby surface 226 that is maintained at a cooler temperature than the reticle 222. The cooler surface 226 may be, for example, a shield that protects the reticle or a differential pumping barrier used in a vacuum chamber housing the reticle 222. A gas in the vicinity of the reticle 222 and the surface 226 exhibits a temperature gradient in which the gas is warmer near the reticle 222 and cooler near the surface 226. The thermophoretic "force" associated with the gradient urges particles 228 away from the warmer reticle 222 toward the cooler surface 226. Some particles 228 may actually become attached to the surface 226. Thermophoretic forces are greatest in the presence of a sufficient gas pressure in which the mean free path of the gas molecules is a small fraction of the distance from the reticle 222 and the surface 226. As pressure is decreased (i.e., as vacuum is increased), thermophoretic forces decrease correspondingly. In other words, thermophoresis loses effectiveness in high vacuum, but at a pressure of 50 mTorr thermophoresis is still significant for effectively keeping particles 228 away from the reticle 222.

A conventional thermophoretic scheme as disclosed in the references cited above is generally shown in FIG. 10, which depicts a portion of an EUVL system 100 in the vicinity of the reticle. The depicted system 100 comprises a vacuum chamber 104 including a first region 108 and a second region 110. The first region 108 contains a reticle stage 114 that supports a reticle chuck 118 configured to hold a reticle 112 face-down. The second region 110 contains projection optics 124 and a wafer stage (not shown). The first and second regions 108, 110 are substantially separated from each other by a barrier wall 126 through which an opening 130 is defined. The barrier wall 126 and opening 130 collectively form a differential pumping barrier. The opening 130 is sufficiently large to pass EUV light incident to and reflected from the reticle 112. Gas at a pressure of approximately 50 mTorr is supplied to the first region 108 via a gas-supply port 132 in the vacuum chamber 104. To minimize EUV-absorption losses to ambient gas, the second region 110 is maintained at a lower pressure (i.e., higher vacuum; e.g., ≦5 mTorr) than the first region 108. Maintaining these two respective pressures in the regions 108, 110 is achieved by differential evacuation of the regions, performed using respective vacuum pumps 134, 136 and facilitated by the differential pumping barrier.

In the configuration shown in FIG. 10, to urge particles away from the reticle 112 by thermophoresis, the reticle is maintained at a higher temperature than the barrier wall 126. This temperature differential, as discussed above, results in attraction of the particles to the barrier wall 126, which causes some particles (entrained in gas passing through the opening 130) to enter the second region 110 via the opening 130. The flow of gas from the region 108 to the region 110 also helps convey particles away from the reticle 112 and thus prevents the particles from contacting the reticle.

While placing a cooler surface proximal to a warmer reticle helps reduce particulate contamination of the reticle, maintaining surfaces of different temperatures within the EUVL system can be problematic. For example, maintaining surfaces at different temperatures can complicate temperature control of critical subsystems and can generate issues relating to thermal expansion and distortion of critical components. For example, thermal expansion or distortion of the reticle can compromise the performance of the overall EUVL lithography process and hence of the semiconductor-device-fabrication process. Also, flowing gas from the region 108 to the region 110 may sweep particles originating in the region 108 toward the reticle 112, which would increase the risk of contamination despite the generally enhanced protection afforded by thermophoresis to other regions of the reticle.

One manner of solving this problem is described in U.S. patent application Ser. No. 10/898,475, incorporated herein by reference, filed on Jul. 23, 2004, by the current Applicant. Briefly, a space is defined between the reticle and a nearby surface, such as a barrier wall or reticle shield. Gas nozzles are situated in the space. A gas, cooled to below the temperature of the reticle and surface (the reticle and surface normally have substantially the same temperature), is discharged from the nozzles into the space. The discharged gas, flowing substantially parallel to the reticle and surface, establishes local respective temperature gradients adjacent the reticle and surface. The temperature gradients engender respective thermophoretic forces tending to keep particles entrained in the gas and away from the reticle and surface.

A particular configuration of the apparatus 300 described in the '475 application is shown in FIG. 11, which depicts a reticle 302 supported by a reticle chuck 304 mounted face down on a reticle stage 306. The reticle stage 306, reticle chuck 304, and reticle 302 are contained in a reticle chamber 308 that is separated from a projection-optics chamber 310 by a barrier wall 312 (e.g., a differential pumping barrier or reticle shield). The barrier wall 312 defines a "fixed-blind aperture" 314 that is sized and configured to allow illumination EUV light 316 to impinge on the desired region of the reticle 302 and to pass patterned EUV light 318 reflected from the reticle to downstream projection optics (not shown). The fixed-blind aperture 314 also helps establish and maintain the differential pressures in the two chambers 308, 310. The reticle chamber 308 is typically at approximately 50 mTorr (and thus is a "higher-pressure" region), and the projection-optics chamber 310 is typically at less than 1 mTorr (and thus is a "lower-pressure" region). During exposure, to illuminate successive regions of the reticle 302, the reticle stage 306 moves in a scanning manner relative to the fixed-blind aperture 314. Flanking the fixed-blind aperture 314 and extending upward (in the figure) toward the reticle 302 are nozzle manifolds 320a, 320b that define nozzle openings 322a, 322b for discharging the gas. The nozzle openings 322a, 322b are oriented so as to discharge the gas into the space 324, between the reticle 302 and the barrier wall 312, in a direction substantially parallel to the reticle. The flow of gas (note arrows 326) away from the nozzle openings 322a, 322b past the reticle 302 is substantially laminar. The nozzle openings 322a, 322b may be covered by filters (not shown) that can prevent the admission of particles into the space 324 and can also limit the velocity of gas flow.

As noted above, the gas can be cooled before discharging the gas into the space 324 between the reticle 302 and barrier wall 312. Alternatively, the nozzle openings 322a, 322b are sized and configured to establish a substantially higher gas pressure at the nozzle openings than in the space 324. Thus, discharge of the gas is accompanied by adiabatic cooling of the gas. I.e., as the gas is discharged into the space 324, it expands rapidly out of the nozzle openings 322a, 322b and cools significantly in the process. With such a configuration, the discharged gas is colder than the reticle 302 and barrier wall 312 and establishes the desired temperature gradient without having to pre-cool the gas. In addition, the relatively high gas pressure at the nozzle openings 322a, 322b produces a high gas-flow velocity through the space 324. This high-velocity flow establishes a substantial viscous-drag force on particles and tends to convey the particles out of the space 324 and thus away from the reticle 302.

As indicated by the multiple arrows 326, most of the discharged gas (and entrained particles) flows laterally as shown, substantially parallel to the reticle 302, through the space 324 and is exhausted via the vacuum pump (not shown but see item 134 in FIG. 10) that evacuates the reticle chamber 308.

Referring further to FIG. 11, the nozzle manifolds 320a, 320b extend upward (in the figure) and form respective narrow gaps G between the "tops" of the nozzle manifolds and the surface of the reticle 302. These gaps G, each approximately 1 mm or less, allow limited movement of the reticle 302 (in the vertical, or "Z," direction) as required for focus control and reticle-wafer alignment movements. The narrow gaps G also allow a limited flow of gas (note single arrows 330 compared to multiple arrows 326) from the space 324 through the fixed-blind aperture 314 to the projection-optics chamber 310. The gas flow through the gaps G is limited to maintain the desired vacuum level in the projection-optics chamber 310 for minimal attenuation of the EUV illumination and patterned beams.

Because of the small distance between the reticle 302 and the top of the nozzle manifolds, maintaining a temperature gradient, and hence thermophoretic protection, within the gaps G can be problematic. Therefore, protection of the reticle is somewhat weaker within the gaps G. However, the flow of gas through the gaps G, from the higher-pressure region 308 to the lower-pressure region 310, will provide some viscous drag force to convey particles into the lower-pressure region 310 and away from the reticle 302. Also, during normal reticle scanning, a given area of the reticle 302 spends only a fraction of the time within the gaps G. Much of the time the reticle lies within the space 324 in which thermophoretic protection and gas drag are available.

In a conventional EUVL system, illumination of the reticle 302 is non-telecentric. Consequently, movement or displacement of the reticle 302 in the axial direction (vertical direction in the figure) causes corresponding image movement at the wafer, which is problematic. Consequently, the "height" of the reticle 302 must be controlled very accurately and precisely to avoid image distortion at the wafer. An example specification for reticle-height control is 50 nm peak-to-valley over the surface of the reticle 302. Achievement of such height control requires corresponding measurements of reticle height, which is performed using a very accurate and precise autofocus (AF) system at the reticle 302.

Accurate measurements of reticle height performed using an AF system require that the AF system be calibrated periodically such as during use of the reticle 302 and whenever a new reticle is mounted to the reticle chuck 304. The AF-system calibration involves scanning the patterned regions of the surface of the reticle 302 with an array of multiple light beams (e.g., 50-70 individual laser beams, at near-grazing incidence on the reticle surface). The beams are reflected from the reticle surface, which is accompanied by some diffraction and scattering of the beams. The reflected beams propagate to respective sensors. At each sensor the respective position of the reflected beam is a function of the reticle "height" at the particular incidence locus of the beam on the reticle. The sensor outputs are averaged to obtain data concerning the mean height of the area actually being measured. The calibration covers an area of the reticle 302 that is larger than the area illuminated at any instant by the EUV illumination beam (i.e., larger than the opening of the fixed-blind aperture 314). Consequently, the fixed-blind aperture 314 (with nozzle manifolds 320a, 320b) is moved out the way (retracted) for the AF-system calibration.

For reasons discussed more thoroughly later below, retraction of the nozzle manifolds 320a, 320b and of the fixed-blind aperture 314 disrupts the gas flow 330 used for establishing differential pressures in the chambers 308, 310 and for providing protection of the reticle 302 in the region of the reticle adjacent the gaps G and fixed-blind aperture. (Thermophoretic protection of other portions of the reticle, namely in the space 324, is maintained.) This situation is shown in the gas-flow image in FIG. 4, which shows a gas flow of approximately 50 m/sec in the space 324 but no gas flow in the gap G. As a result, reticle protection from particulate contamination is compromised and the pressure in the projection-optics chamber 310 is undesirably increased.

SUMMARY

The deficiencies of conventional systems, as summarized above, are addressed by devices and methods as disclosed herein.

According to a first aspect, lithography systems are disclosed. An embodiment of such a system comprises a vacuum chamber that includes a first chamber portion and a second chamber portion. A member, situated between the first and second chambers, defines an exposure aperture. A reticle stage is situated in the first chamber portion and is configured to hold a reticle movably relative to the exposure aperture. A gas-discharge port is situated and configured to deliver a gas with a temperature gradient into the first chamber portion so as to establish a thermophoretic condition with respect to at least a portion of the reticle. A fixed-blind-aperture assembly, that is movable relative to the exposure aperture and the reticle to an exposure position and to a non-exposure position, defines an illumination aperture through which light from the second chamber portion and gas from the first chamber portion can pass through the exposure aperture when the fixed-blind-aperture is in the exposure position. A gas-passage aperture is displaced from the exposure aperture so as to conduct the gas, passing through the illumination aperture, from the first chamber portion to the second chamber portion when the fixed-blind-aperture assembly is in the non-exposure position. The gas-passage aperture is defined in the member.

In an embodiment the fixed-blind-aperture assembly is situated in the first chamber portion between the member and the reticle and separated from the reticle by a gap. In this configuration the gas flows through the gap from first chamber portion through the exposure aperture to the second chamber portion when the fixed-blind-aperture assembly is in the exposure position, and flows through the gap from the first chamber portion through the gas-passage aperture to the second chamber portion when the fixed-blind-aperture assembly is in the non-exposure position. In this embodiment the fixed-blind-aperture assembly can comprise the gas-discharge port.

In another embodiment the system further comprises at least one moving blind situated between the fixed-blind-aperture assembly and the member. The moving blind in this embodiment is configured to move so as to cover the exposure aperture at selected times. The moving blind can be movable to cover the exposure aperture whenever the fixed-blind-aperture assembly is in the non-exposure position. The moving blind can be configured to define an aperture that is situated so as to conduct, when the moving blind is covering the exposure aperture and the fixed-blind-aperture is in the non-exposure position, gas that has passed from the first chamber portion through the illumination aperture to the gas-passage aperture. The gas-passage aperture and the aperture in the moving blind can be aligned with each other when the moving blind is covering the exposure aperture and the fixed-blind-aperture assembly is in the non-exposure position.

In many embodiments the reticle extends and the reticle stage is configured to move the reticle in an X-direction and in a Y-direction. In such a configuration the moving blind can comprise a moving X-blind and a moving Y-blind, wherein the aperture in the moving blind is defined in at least one of the X-blind and Y-blind.

In embodiments in which the gas-passage aperture is defined in the member, the member further can comprise a collar extending around the gas-passage aperture and toward the moving blind so as to form at least a partial seal for passage of gas through the respective apertures in the moving blind and member when the fixed-blind-aperture assembly is in the non-exposure position.

In embodiments in which the moving blind comprises first and second blind portions that are movable relative to each other, at least one of the first and second blind portions can be movable to cover the exposure aperture when the fixed-blind-aperture assembly is in the non-exposure position. In such an embodiment the first and second blind portions can be situated, when the fixed-blind-aperture assembly is in the non-exposure position and the at least one blind portion is covering the exposure aperture, relative to each other to form a gas-passage gap between them. Furthermore, the gas-passage gap can be situated so as to conduct, when the at least one moving blind is covering the exposure aperture and the fixed-blind-aperture is in the non-exposure position, the gas passing through the illumination aperture from the first chamber portion to the second chamber portion.

In another embodiment the fixed-blind-aperture assembly can be configured such that, whenever it is in the non-exposure position, a space is provided between the exposure aperture and the reticle. In the space a measurement can be performed of reticle position using at least one laser beam directed to and incident on the reticle at an oblique angle. The measurement can pertain to a reticle-autofocus measurement performed using an array of multiple laser beams directed to and incident on the reticle.

Certain embodiments of the lithographic system further comprise at least one of an illumination-optical system, a projection-optical system, and a wafer stage contained in the second chamber portion.

Also, in certain embodiments of the lithographic system, the light passing from the second chamber portion through the exposure aperture and the fixed-blind aperture comprises a beam of extreme UV light.

Another embodiment of a lithography system comprises chamber means, dividing means, reticle-stage means, gas-introduction means, and fixed-blind-aperture means. The dividing means is for dividing the chamber means into a first chamber portion and a second chamber portion and for defining an exposure aperture by which light passes from the second chamber portion to the first chamber portion and from the first chamber portion to the second chamber portion. The reticle-stage means is for holding a reticle, in the first chamber portion, movably relative to the exposure aperture so as to allow the reticle to receive light from the second chamber portion and to reflect the light to the second chamber portion. The gas-introduction means is for introducing a gas with a temperature gradient into the first chamber portion relative to the reticle. The fixed-blind-aperture means is for defining a fixed-blind illumination aperture and for moving the illumination aperture, relative to the exposure aperture and the reticle, to an exposure position and to a non-exposure position. Thus, light from the second chamber portion and the gas from the first chamber portion pass through the exposure aperture whenever the fixed-blind-aperture means is in the exposure position. The dividing means further can define gas-passage means for conducting the gas, passing through the illumination aperture, from the first chamber portion to the second chamber portion when the fixed-blind-aperture means is in the non-exposure position.

In certain embodiments the gas-passage means does not pass significant amounts of the gas when the fixed-blind-aperture means is in the exposure position.

Certain other embodiments also comprise moving-blind means for substantially blocking the exposure aperture to passage of light and gas whenever the moving-blind means is in a closed condition, and allowing passage of light through the exposure aperture whenever the moving-blind means is in an open condition. The moving-blind means can comprise at least one moving blind defining an aperture that, when the moving blind is in an open condition, allows passage therethrough of gas passing through the illumination aperture to the gas-passage means. In certain embodiments the moving blind defines collar means extending around the aperture and toward the illumination aperture to provide seal means for gas passing from the illumination aperture to the gas-passage means.

In certain embodiments the light passing from the second chamber portion to the first chamber portion comprises a beam of extreme UV light.

Yet another embodiment of a lithography system comprises a vacuum chamber comprising a first chamber portion and a second chamber portion separated from the first chamber portion by a barrier plate defining an exposure aperture. A reticle stage is situated in the first chamber portion and is configured to hold a reticle movably relative to the exposure aperture. A fixed-blind-aperture assembly is situated in the first chamber portion between the reticle and the barrier plate and is separated from the reticle by a gap. The fixed-blind-aperture assembly is movable relative to the exposure aperture and the reticle to an exposure position and a non-exposure position, the fixed-blind-aperture assembly comprises a nozzle manifold that is configured to flow a gas with a temperature gradient into the first chamber portion relative to the reticle sufficiently to establish a thermophoretic condition with respect to at least a portion of the reticle. The fixed-blind-aperture assembly defines an illumination aperture through which illumination light from the second chamber portion, patterned light from the first chamber portion, and gas passing through the gap from the first chamber portion can pass through the exposure aperture when the fixed-blind-aperture is in the exposure position. The barrier member defines a gas-passage aperture that is separate from the exposure aperture. The gas-passage aperture is situated so as to conduct the gas passing through the illumination aperture from the first chamber portion to the second chamber portion when the fixed-blind-aperture assembly is in the non-exposure position.

Certain embodiments of the system summarized above can further comprise a moving X-blind and a moving Y-blind situated between the fixed-blind-aperture assembly and the barrier plate. The X-blind and Y-blind are cooperatively movable to allow, at selected times when the fixed-blind-aperture assembly is in the exposure position, passage of light and gas through the exposure aperture and to block, at selected times when the fixed-blind-aperture assembly is in the non-exposure position, passage of significant amounts of light and gas through the exposure aperture.

The non-exposure position can define a space, between the exposure aperture and the reticle, that is suitable for performing a measurement of reticle position using at least one laser beam directed to and incident on the reticle at a grazing angle of incidence. The measurement can pertain to a reticle-autofocus measurement performed using an array of multiple laser beams directed to and incident on the reticle.

Another aspect is set forth in the context of a lithography system that comprises a vacuum chamber including a member separating the vacuum chamber into first and second chamber portions and defining an exposure aperture by which the chamber portions communicate with each other. A stage is mounted in the first chamber portion and is configured to hold a reticle movably relative to the exposure aperture. A fixed-blind-aperture assembly provides a gas flow with a temperature gradient. The fixed-blind-aperture assembly is movable relative to the reticle to an exposure position and to a non-exposure position, and is separated from the reticle by a gap for passage of gas from the vacuum chamber past the reticle. The fixed-blind-aperture assembly defines an illumination aperture through which illumination light and gas can pass through the exposure aperture whenever the fixed-blind-aperture assembly is in the exposure position. In the context of such a system, the aspect is directed to an improvement in which a gas aperture is defined in the barrier member at a location allowing passage of the gas from the first chamber portion through the gap and through the illumination aperture whenever the fixed-blind-aperture assembly is in the non-exposure position.

Certain embodiments of such a system can further comprise at least one movable blind that is configured to cover the exposure aperture at selected times including when the fixed-blind-aperture assembly is in the non-exposure position. The movable blind can define a gas aperture situated at a location allowing passage of the gas from the first chamber portion through the gap, illumination aperture, and gas aperture in the barrier member whenever the fixed-blind-aperture assembly is in the non-exposure position.

Yet another aspect is set forth in the context of a lithographic method in which a pattern-defining reticle is irradiated by an illumination beam that reflects from the reticle to form a patterned beam. The reticle is mounted inside a first chamber in which a surface of the reticle is irradiated by the illumination beam propagating from a second chamber through an exposure aperture and fixed-blind aperture to the reticle surface to produce a patterned beam that reflects back through the exposure aperture and fixed-blind aperture to the second chamber. In this context, a method is provided for reducing particulate contamination of the reticle surface. In an embodiment of the method, a gas is flowed with a temperature gradient into the first chamber such that the gas contacts the reticle surface and establishes a thermophoretic condition with respect to the reticle surface. For actual irradiation of a region of the reticle surface, the fixed-blind aperture is moved to an exposure position at which the illumination beam can pass through the exposure aperture and the fixed-blind aperture to the region while allowing a flow of a portion of the gas through the fixed-blind aperture and exposure aperture to the second chamber. Thus, the gas flow establishes a protection condition with respect to the irradiated region of the reticle surface in addition to other regions of the reticle surface, and the protection condition serves to reduce particulate contamination of the reticle surface. During a time when the reticle is not being irradiated, the fixed-blind aperture is moved to a non-exposure position while maintaining the flow of the portion of gas through the fixed-blind aperture, at the non-exposure position, to the second chamber.

In certain embodiments the flow of the portion of gas through the fixed-blind aperture at the non-exposure position is maintained by passing the gas flow, after passing through the fixed-blind aperture, through an aperture separate from the exposure aperture.

Certain embodiments can include the step, during the time when the reticle is not being irradiated, of blocking the exposure aperture. The exposure aperture can be blocked using a movable blind. The flow of the portion of gas through the fixed-blind aperture at the non-exposure position can be maintained further by passing the gas flow, after passing through the fixed-blind aperture, through a gas-passage aperture defined in the movable blind, then through the aperture that is separate from the exposure aperture.

Certain embodiments further can comprise the step, during the time when the fixed-blind aperture is at the non-exposure position, of measuring an autofocus position of the reticle. Measuring an autofocus position of the reticle can comprise directing an array of multiple laser beams to be incident at respective locations on the reticle and detecting corresponding beams reflected from the reticle.

The foregoing and additional features and advantages of the subject systems and methods will be more readily apparent from the following detailed description, which proceeds with reference to the accompanying drawings.

BRIEF DESCRIPTION OF THE DRAWINGS

The Patent or application file contains at least one drawing executed in color. Copies of this patent or patent application publication with color drawing(s) will be provided by the Office upon request and payment of the necessary fee.

DETAILED DESCRIPTION

This disclosure is set forth in the context of a representative embodiment, which is not intended to be limiting in any way.

Figure 1A:
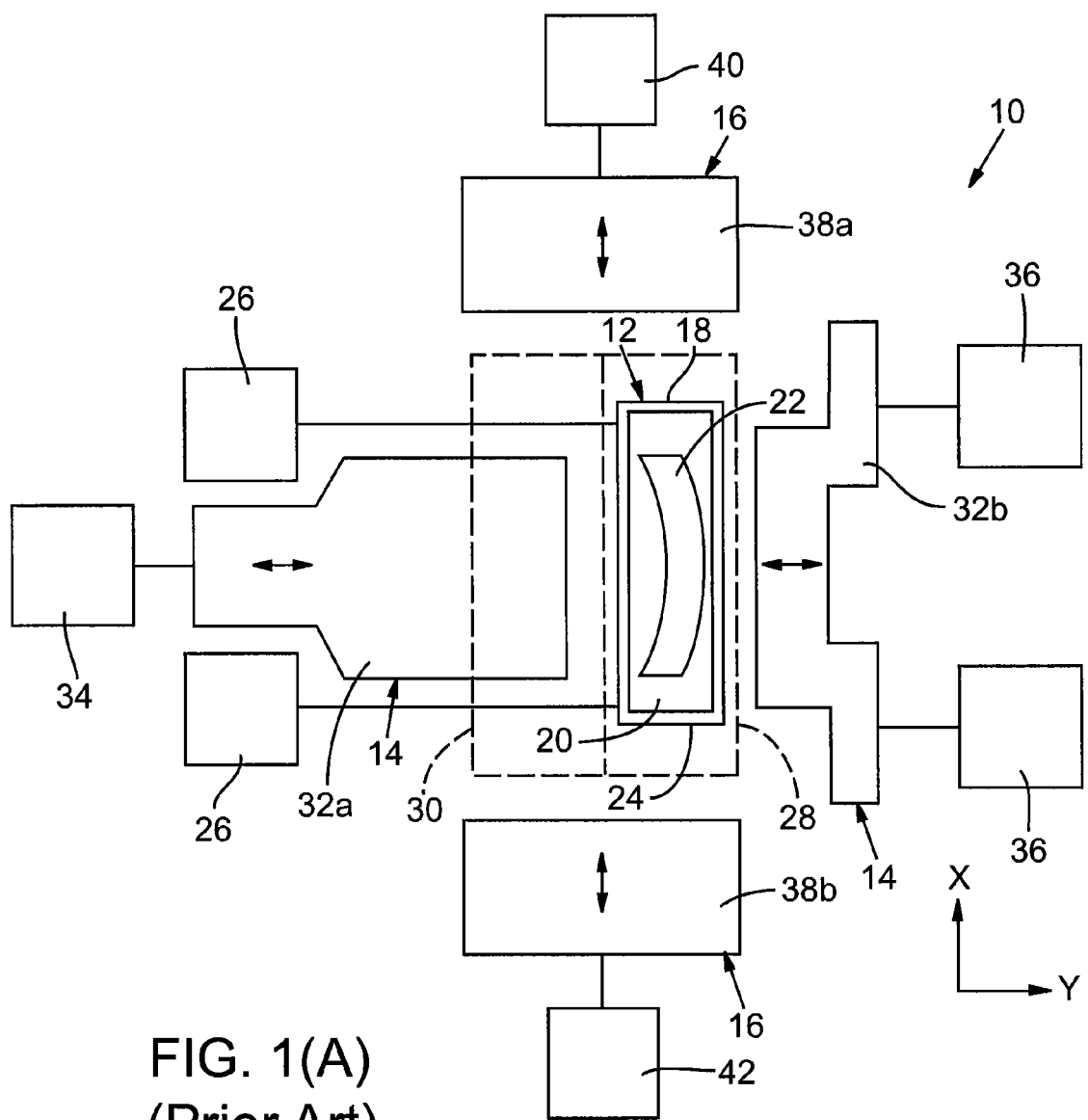
FIG. 1(A) is a schematic plan view of a conventional blind assembly for an EUV lithography reticle, including a general layout of actuators for the various blinds.

The subject apparatus is best understood in the context of a conventional blind assembly 10, which is illustrated in FIGS. 1(A)-1(D). Referring first to FIG. 1(A), a plan view of the blind assembly 10 is shown, which comprises a fixed-blind-aperture assembly 12, a Y-blind assembly 14, and an X-blind assembly 16. The fixed-blind-aperture assembly 12 comprises a fixed-blind aperture 18 that includes an aperture plate 20 defining an illumination aperture 22 that, in this embodiment, has a fixed arcuate profile. The fixed-blind aperture 18 also includes a nozzle manifold 24 that is similar in configuration and operation to the nozzle manifold summarized above. The aperture plate 20 is mounted to the "top" surface (facing the reticle, which is not shown in the figure but is located above and parallel to the plane of the page) of the nozzle manifold 24. The fixed-blind aperture 18 is operably coupled to one or more actuators 26 configured to move the fixed-blind aperture 18 in the Y-direction from an exposure zone 28 to a calibration zone 30 and from the calibration zone back to the exposure zone. The Y-blind assembly 14 comprises a first Y-blind 32a (left in the figure) and a second Y-blind 32b (right in the figure). The first Y-blind 32a is operably coupled to a respective actuator 34 that is configured to move the first Y-blind in the Y-direction. Similarly, the second Y-blind 32b is operably coupled to a respective actuator 36 that is configured to move the second Y-blind in the Y-direction cooperatively with movement of the first Y-blind 32a. The X-blind assembly 16 comprises a first X-blind 38a (upper in the figure) and a second X-blind 38b (lower in the figure). The first X-blind 38a is operably coupled to a respective actuator 40 that is configured to move the first X-blind substantially in the X-direction. Similarly, the second X-blind 38b is operably coupled to a respective actuator 42 that is configured to move the second X-blind substantially in the X-direction cooperatively with movement of the first X-blind 38a and cooperatively with certain movements of the first and second Y-blinds 32a, 32b.

Figure 1B:
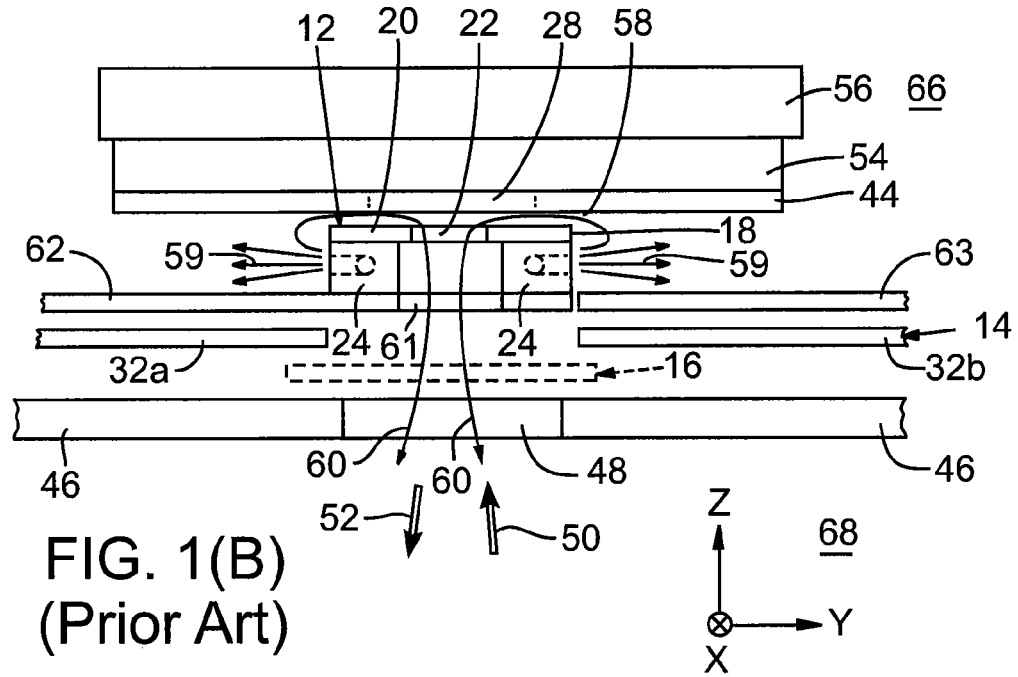
FIG. 1(B) is an elevational view of certain details of the conventional blind assembly of FIG. 1(A), showing flow of gas with a temperature gradient relative to a fixed-blind assembly during an exposure situation.

FIG. 1(B) depicts an exposure situation in which the fixed-blind-aperture assembly 12 is in an exposure position (i.e., in a position in which the fixed-blind aperture 18 is situated adjacent an exposure zone 28 of the reticle 44). In this embodiment the fixed-blind-aperture assembly 12, as well as the Y-blind assembly 14 and X-blind assembly 16, are located upstream of a barrier plate 46 or analogous member.

In one embodiment the barrier plate 46 is configured as an actual dividing wall separating, for example, an upstream chamber 66 (e.g., a first vacuum chamber) from a downstream chamber 68 (e.g., a second vacuum chamber), wherein the upstream and downstream chambers are maintained at respective vacuum levels. For example, the upstream chamber 66 can be maintained at 50 mTorr, and the downstream chamber 68 can be maintained at less than 5 mTorr. In another embodiment, the barrier plate is configured as an extension of a housing (not shown) containing some or all the various actuators 26, 34, 36, 40, 42. In yet another embodiment, the barrier plate serves both as a dividing wall and as a housing for some or all the actuators. The barrier plate 46 defines a fixed exposure aperture 48 that transmits illumination light 50 to the exposure zone 28 and transmits patterned light 52 produced by reflection of the illumination light from the exposure zone.

The reticle 44 is shown mounted, patterned side facing downward, to a reticle chuck 54. The reticle chuck 54 is mounted to a reticle stage 56 that is configured to perform desired movements and positioning motions of the reticle chuck, and thus of the reticle 44 itself, as required for making exposures, for performing autofocus (AF) measurements using an AF system (not shown), and for calibrating the AF system. Just downstream of the reticle 44 is the fixed-blind-aperture assembly 12 that includes the aperture plate 20 and nozzle manifold 24. A narrow gap 58 is defined between the aperture plate 20 and the surface of the reticle 44. As discussed above, the gap 58 allows passage of a portion of the gas (arrows 59), discharged from the nozzle manifold 24, through the exposure aperture 48 (note arrows 60). The nozzle manifold 24 is mounted to a support member 62 (e.g., a plate) that, in turn, is operably coupled to actuators (not shown, but see item 26 in FIG. 1(A)). The support member 62 defines an aperture 61 that allows passage of illumination light 50 through the illumination aperture 22 to the reticle 44, passage of patterned light 52 from the reticle 44, and passage of the gas 60 from the gaps 58. In FIG. 1(B) the support member 62 is positioned sufficiently to the right (in the figure) so as to abut a reticle shield 63.

In FIG. 1(B) the first Y-blind 32a and second Y-blind 32b are in respective "open" positions that allow transmission of the illumination light 50, passing through the exposure aperture 48, to the reticle 44 for exposure. Similarly, the first X-blind 38a and second X-blind 38b are in respective "open" positions. Placing the X-blinds 38a, 38b in their respective fully open positions allows use of the full X-dimension width of the exposure aperture 48, which is as wide in the X-direction as the largest planar dimension (in the X-direction) of the patterned area of the reticle 44. For example, if the largest planar dimension is 100 mm, then the X-dimension width of the exposure aperture 48 is approximately 100 mm. The width of the exposure aperture 48 in the Y-direction is as required for scanning illumination of the successive exposure regions of the patterned area of the reticle 44. By way of example, the Y-dimension width of the exposure aperture 48 is approximately 30 mm, which is sufficiently wide to transmit illumination light 50 through the arc-shaped illumination aperture 22 (which has, by way of example, a radial width of 8 mm).

The patterned area on the reticle 44 is bounded by a narrow border (not shown but having a width of 1 mm, for example) of non-reflective material that absorbs incident radiation. During normal exposure the X-blinds 38a, 38b are open sufficiently to provide illumination of the full X-dimension width of the patterned area of the reticle 44 (illumination actually extends into the border) while preventing illumination of the reticle outside the border. During exposure the fixed-blind aperture 18 remains stationary in the position shown in FIG. 1(B). Meanwhile, the reticle 44 is moved (by the reticle stage 56) in a continuous Y-direction motion past the illumination aperture 22 to illuminate the patterned area extending in the Y-direction. During the Y-direction scan, the Y-blinds 32a, 32b are opened sufficiently and moved in a coordinated manner to track the exposure. I.e., the Y-blinds 32a, 32b are open sufficiently (e.g., 30 mm) to follow the leading and trailing edges of the region of the reticle that is actually being illuminated during a particular instant by illumination light 50 passing through the illumination aperture 22.

Figure 1C:
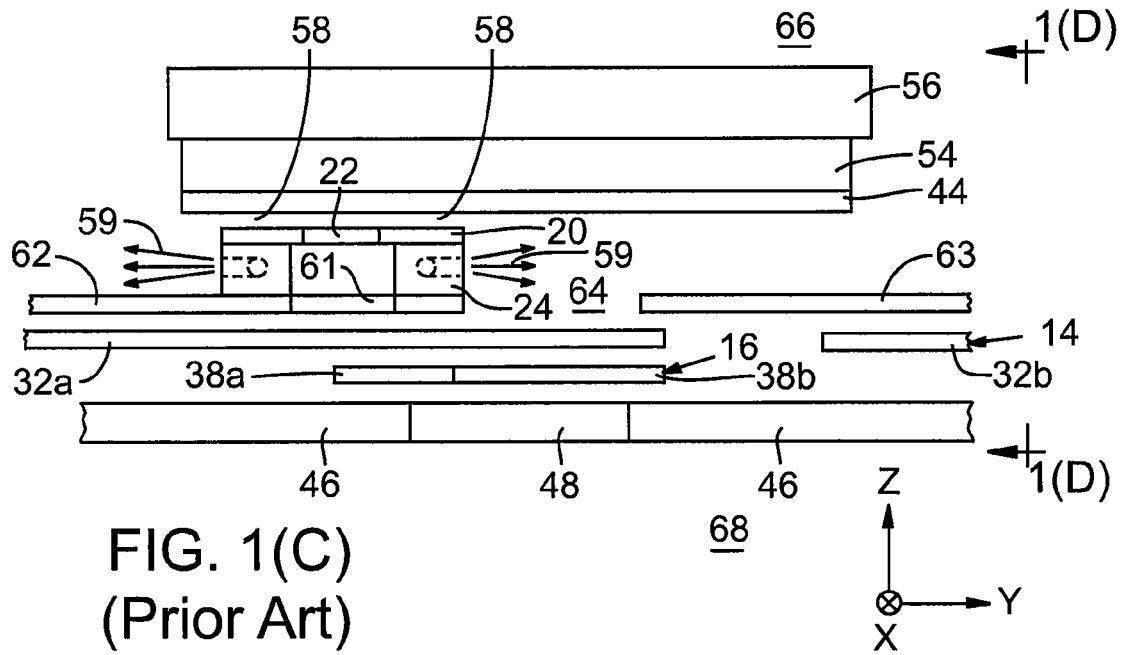
FIG. 1(C) is an elevational view of certain details of the conventional blind assembly of FIG. 1(A), showing flow of gas with a temperature gradient relative to the fixed-blind assembly during a calibration situation in which the fixed-blind assembly is retracted to provide space for propagation of at least one calibration beam (such as of a reticle-autofocus system, not shown) to and from the reticle.
Figure 1D:
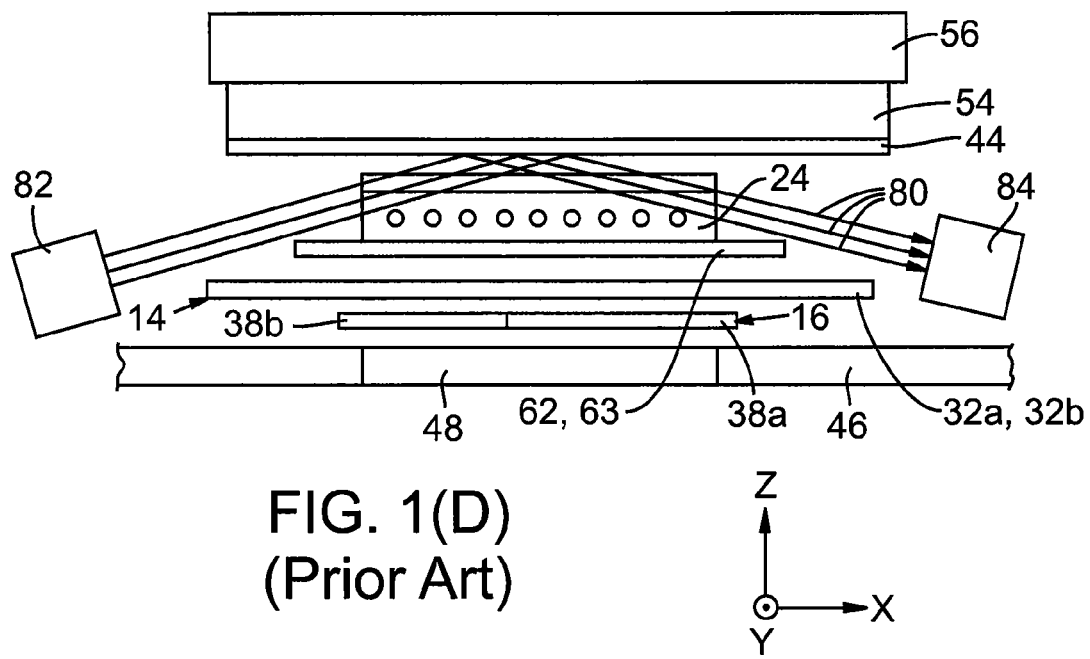
FIG. 1(D) is an elevational view of the assembly shown in FIGS. 1(B) and 1(C) as viewed along the lines indicated in FIG. 1(C), particularly showing the propagation of three exemplary calibration beams to and from the reticle.

Turning now to FIGS. 1(C) and 1(D), for calibration of the AF system, the X-blinds 38a, 38b are fully closed and the Y-blinds 32a, 32b are at their maximally closed positions. Also, the fixed-blind-aperture assembly 12 has been moved (leftward in FIG. 1(C)) in the Y-direction parallel to the surface of the reticle 44 by the support member 62 so as to retract the fixed-blind-aperture assembly laterally away from the reticle shield 63. These motions of the fixed-blind-aperture assembly 12 and blinds 32a, 32b, 38a, 38b clear a space 64 in which the array of calibration beams 80 (typically 50-70 beams, but only three are shown in FIG. 1(D)) can, without obstruction, propagate to, impinge on, and reflect from respective locations on the surface of the reticle 44. The area of the reticle surface illuminated by the calibration beams 80 typically is larger than the area that is illuminated at any instant by the illumination light 50. By way of example, the calibration beams 80, propagating from a beam source 82, impinge obliquely on the surface of the reticle 44 at angles of incidence of approximately 84° (i.e., approximately 6° from the surface of the reticle), with respective cone angles of approximately 3° for each beam. The calibration beams 80 propagate substantially in the X-direction from respective sources 82 to respective sensors 84.

Comparing FIG. 1(B) to FIG. 1(C), it can be seen that, in FIG. 1(B), a portion of the gas stream (arrows 59) discharged from the nozzle manifold 24 passes through the gaps 58 and travels downward (arrows 60) through the illumination aperture 22, past the open blinds, and through the exposure aperture 48. This gas stream 60 is sufficient to provide thermophoretic protection in the region of the reticle 44 adjacent the gaps 58 and illumination aperture 22. In FIG. 1(C), in contrast, the first Y-blind 32a (or, in some embodiments, both Y-blinds) blocks passage of the gas stream 60 and thus obstructs flow of gas through the gaps 58. This obstructed flow of gas through the gaps 58 interrupts thermophoretic protection in the regions of the reticle 44 adjacent the gaps 58 and illumination aperture 22, which creates a condition in which these regions of the reticle 44 are vulnerable to particulate contamination. The flow of gas 59 elsewhere relative to the reticle 44 meanwhile maintains thermophoretic protection in those regions of the reticle.

The condition described above is avoided by the embodiment shown in FIGS. 2(A) and 2(B), in which are shown a fixed-blind-aperture assembly 412, a Y-blind assembly 414, an X-blind assembly 416, a fixed-blind aperture 418, an aperture plate 420, an illumination aperture 422, a nozzle manifold 424, a first Y-blind 432a, a second Y-blind 432b, a first X-blind 438a, a second X-blind 438b, a reticle 444, a barrier plate 446, an exposure aperture 448, a reticle chuck 454, a reticle stage 456, a gap 458, a support member 462 (defining an aperture 461), a reticle shield 463, and a space 464. These components are similar to corresponding components shown in FIGS. 1(A)-1(D).

Figure 2A:
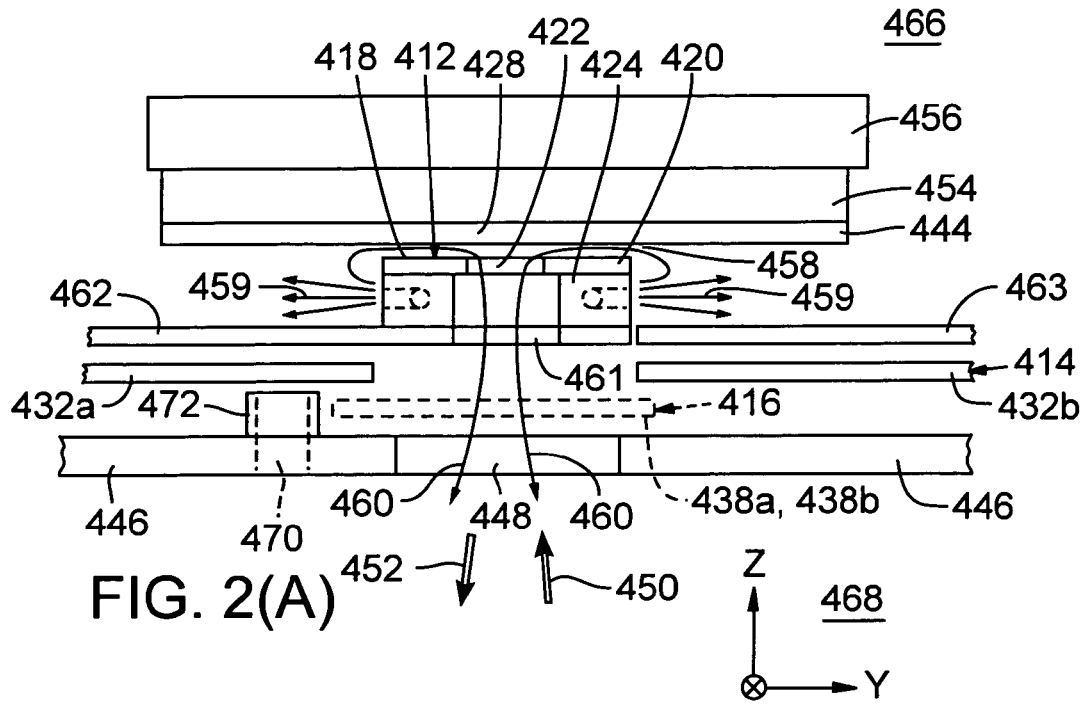
FIG. 2(A) is an elevational view of certain details of a representative embodiment of a blind assembly, showing flow of gas with a temperature gradient relative to a fixed-blind assembly during an exposure situation.

FIG. 2(A) depicts an exposure situation in which the fixed-blind-aperture assembly 412 is in an exposure position (i.e., in a position in which the fixed-blind aperture 418 is situated adjacent an exposure zone 428 of the reticle 444). The barrier plate 446 defines a fixed exposure aperture 448 that transmits illumination light 450 to the exposure zone 428 and transmits illumination patterned light 452 produced by reflection of the illumination light from the exposure zone. In this situation this embodiment functions substantially identically to the configuration shown in FIG. 1(B).

Figure 2B:
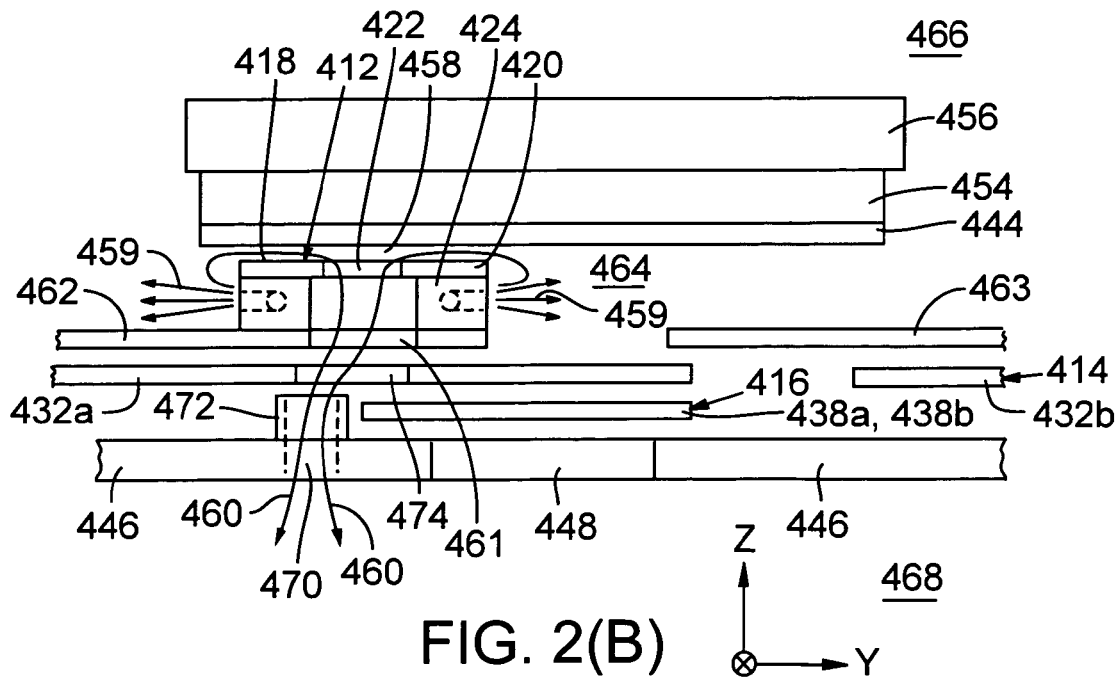
FIG. 2(B) is an elevational view of certain details of the blind assembly of FIG. 2(A), showing flow of gas with a temperature gradient relative to the fixed-blind assembly during a calibration situation in which the fixed-blind assembly is retracted to provide space for propagation of at least one calibration beam (such as of a reticle-autofocus system, not shown) to and from the reticle.

FIG. 2(B) depicts a situation in which the components are arranged for calibration of the AF system. In this arrangement the X-blinds 438a, 438b are fully closed and the Y-blinds 432a, 432b are at their maximally closed positions. (Regarding the Y-blinds 432a, 432b, in some embodiments they fully come together in their maximally closed positions. In other embodiments, they remain separated from each other, such as shown in FIG. 2(B), in their maximally closed positions. Exemplary separations in the fully closed position are 25 mm or 80 mm.) Also, the fixed-blind-aperture assembly 412 has been moved (leftward in the figure) in the Y-direction by the support member 462 so as to retract the fixed-blind-aperture assembly laterally away from the reticle shield 463. This motion of the fixed-blind-aperture assembly 412 clears a space 464 in which the AF-system-calibration beams (not shown) can, without obstruction, propagate to, impinge on, and reflect from respective locations on the surface of the reticle 444. The key differences in the embodiment of FIG. 2(B) relative to the configuration shown in FIG. 1(C) are as follows: In the embodiment of FIG. 2(B) the barrier plate 446 defines an aperture 470 that is in communication with the aperture 461 in the support member 462 and with the illumination aperture 422 whenever the support member 462 has retracted the fixed-blind-aperture assembly 412 to the left (in the figure) for AF-system calibration or other purpose. The barrier plate 446 in this embodiment also includes a collar 472 or analogous structure extending around the aperture 470 and upwards in the figure toward the first Y-blind 432a, but the collar 472 does not actually contact the first Y-blind 432a. In addition, the first Y-blind 432a in this embodiment defines an aperture 474 that is in communication with the aperture 470 and with the aperture 461 whenever the support member 462 has retracted the fixed-blind-aperture assembly 412 to the left (in the figure) for AF-system calibration.

As a result of mutual communication established among the apertures 422, 461, 470, 474, the portion 460 of the gas 459 discharged from the nozzle manifold 424 still can pass through the gaps 458 and out through the apertures 422, 461, 470, 474. Thus, thermophoretic protection of the reticle 444 is maintained opposite the gaps 458 and illumination aperture 422 whenever the fixed-blind-aperture assembly 412 is retracted.

"In communication with" does not require that the aperture 470 be completely (e.g., axially) aligned with the apertures 461 and/or 474; but, these apertures 470, 461, 474 can be so aligned if desired. Not having these apertures 470, 461, 474 be completely aligned with each other may serve a useful purpose such as creating a baffle effect to gas passing through them, and this effect can be usefully applied for establishing desired differential pressures in the chambers 466, 468.

As indicated in FIGS. 2(A) and 2(B), the respective vertical distances between the reticle shield 463 and the second Y-blind 432b, between the support member 462 and the first Y-blind 432a, between the Y-blinds and the X-blinds 438a, 438b, between the "top" of the collar 472 and the first Y-blind 432a, and between the X-blinds and the barrier plate 446 are such that actual contact of vertically adjacent components is avoided while providing desired minimal clearances between them. These minimal clearances facilitate differential pumping of the chambers 466, 468 as desired. By way of example, because the absolute pressures in the chambers 466, 468 are low during normal use, the vertical clearance between these vertically adjacent components can be as large as approximately 1 mm, which avoids having to use sliding seals.

Figure 3A:
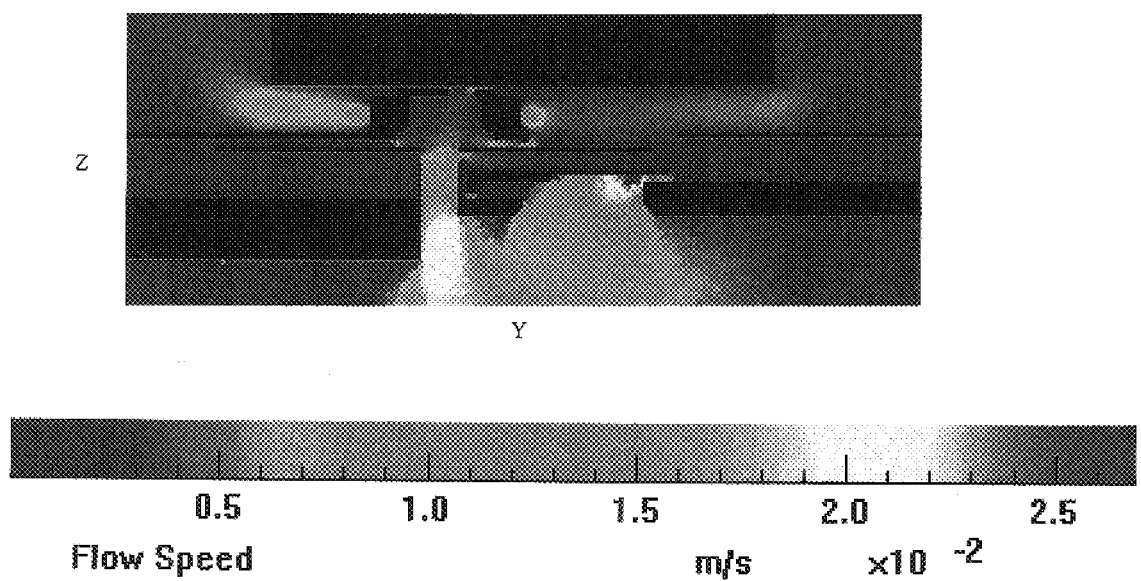
FIG. 3(A) is a color image produced by a computer program simulating the behavior of the embodiment of FIGS. 2(A)-2(B), showing regions of substantial flow of gas with a temperature gradient during the calibration situation.
Figure 3B:
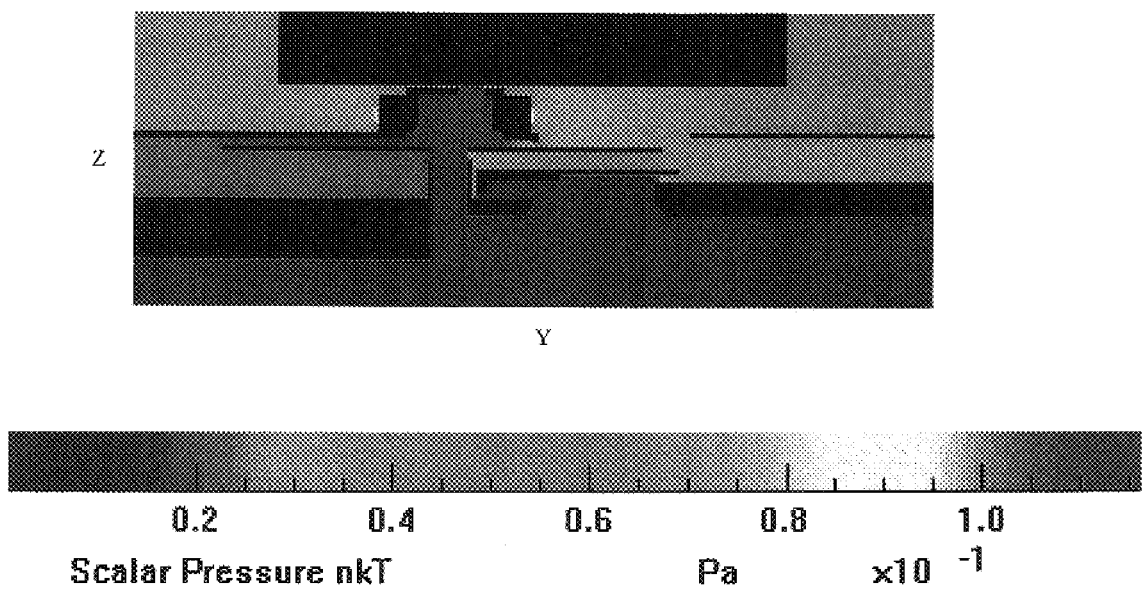
FIG. 3(B) is a color image produced by a computer program simulating the behavior of the embodiment of FIGS. 2(A)-2(B), showing regions of different scalar pressure during the calibration situation.
Figure 4:
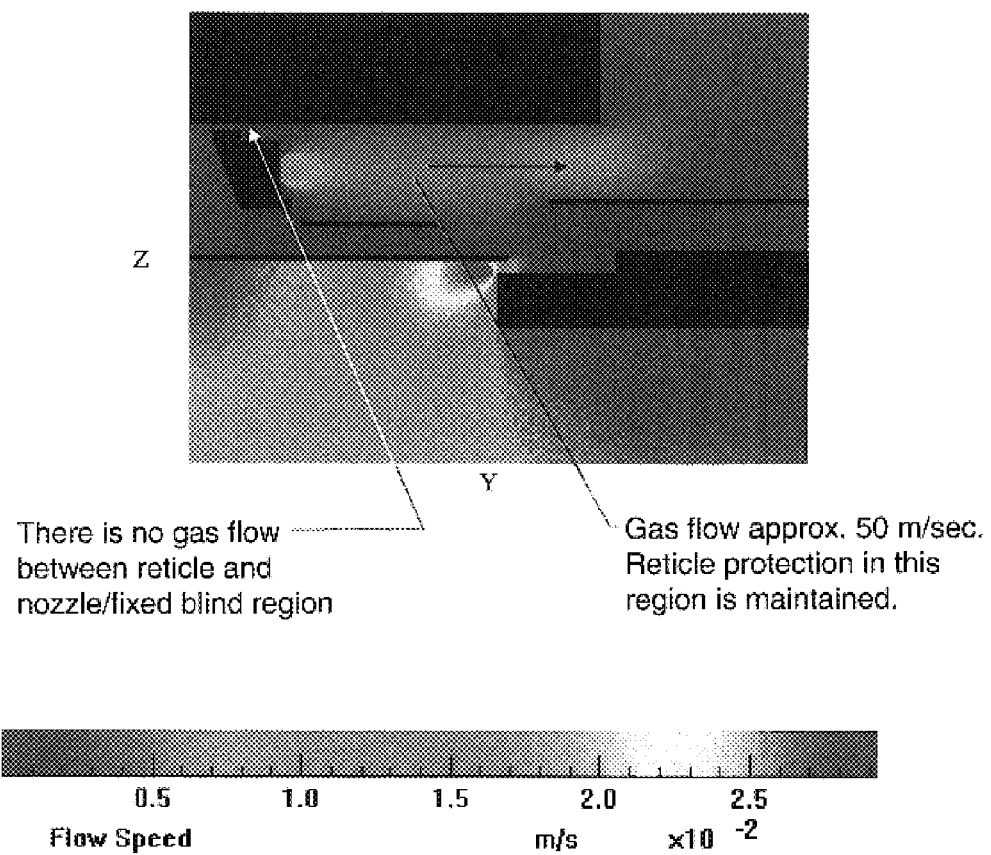
FIG. 4 is a color image produced by a computer program simulating the behavior of the conventional blind assembly of FIGS. 1(A)-1(D), showing regions of different gas velocity during 5.4 seconds of a calibration situation.

The advantageous flow 460 of gas through the gaps 458 and through the apertures 422, 461, 474, 470 during a condition in which the fixed-blind-aperture assembly 412 is retracted (as shown in FIG. 2(B)) is shown in FIGS. 3(A)-3(B) showing the results of computer simulations. In FIG. 3(A) the gas flow 459 is evident by the green color against the blue background. Also evident by green color is gas flow 460 through the gaps 458 and through the apertures 422, 461, 474, and 470, as well as through the lumen of the collar 472. Establishment of a desired differential pressure is depicted in FIG. 3(B), showing clearly the higher scalar pressure in the chamber 466 and lower scalar pressure in the chamber 468.

Figure 5A:
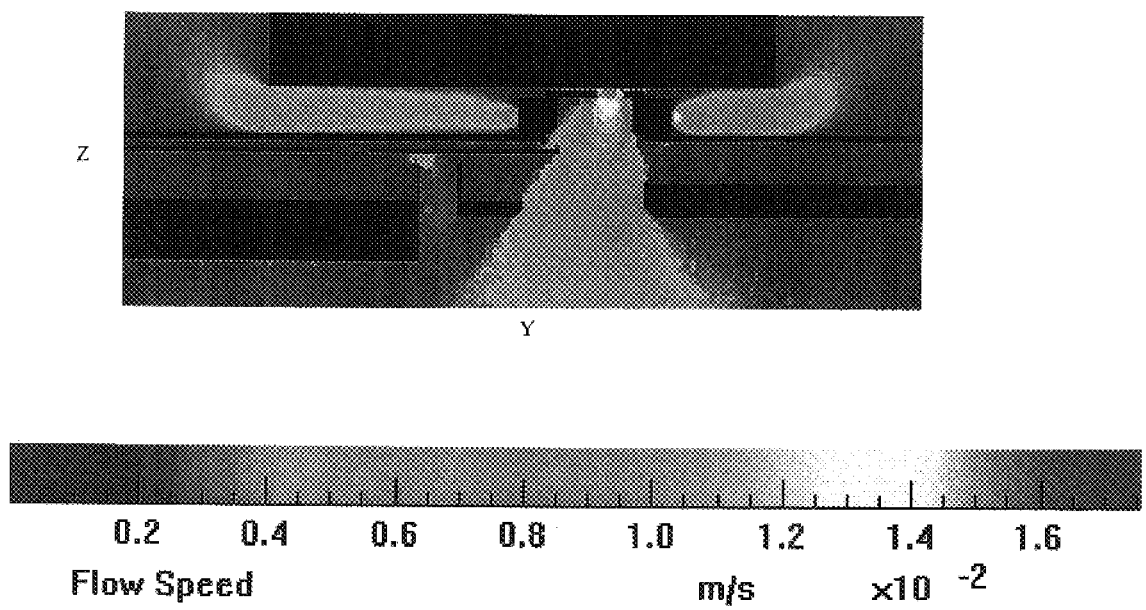
FIG. 5(A) is a color image produced by a computer program simulating the behavior of the embodiment of FIGS. 2(A)-2(D), showing regions of substantial flow of gas with a temperature gradient during an exposure situation.
Figure 5B:
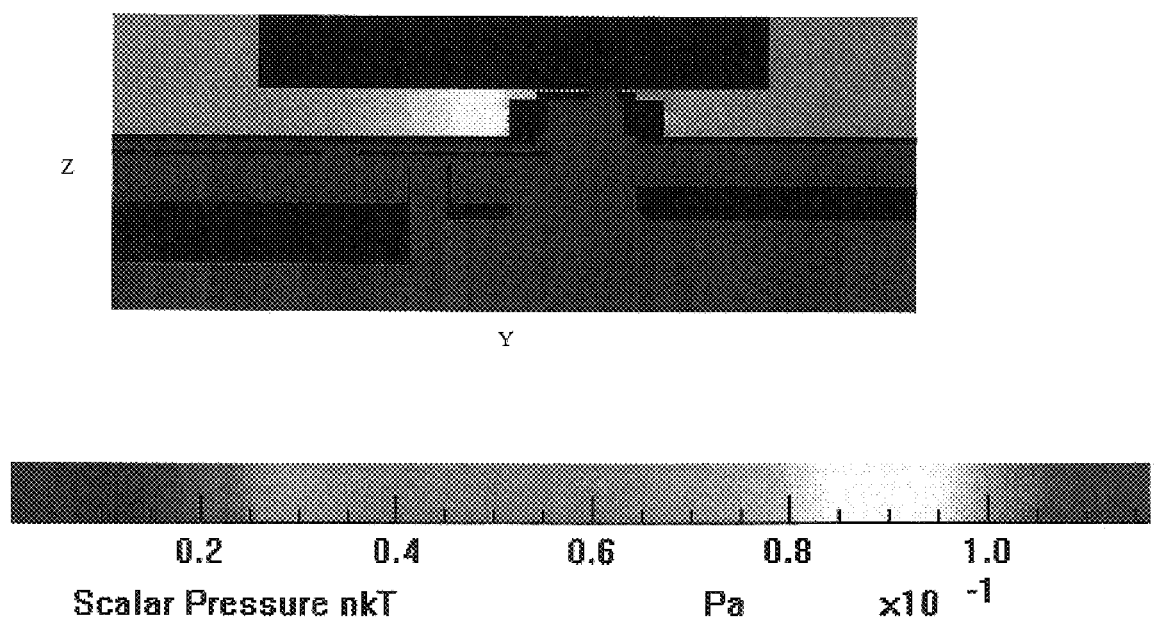
FIG. 5(B) is a color image produced by a computer program simulating the behavior of the embodiment of FIGS. 2(A)-2(D), showing regions of different scalar pressure during the exposure situation.

For comparison purposes, gas-flow velocity and differential-pressure images for the situation shown in FIG. 2(A), in which the fixed-blind-aperture assembly 412 is not retracted but rather is in an exposure position, are provided in FIGS. 5(A) and 5(B), respectively. FIG. 5(A) clearly shows good gas flow 459 past the surface of the reticle 444 as well as good gas flow 460 through the gaps 458 and through the illumination aperture 422. Note that the collar 472 and first Y-blind 432a inhibit substantial gas flow through the aperture 470. FIG. 5(B) shows good maintenance of respective differential pressures in each of the chambers 466 and 468.

In another embodiment, it is possible to eliminate the aperture 474 in the right Y-blind 432a by configuring the Y-blinds 432a, 432b to move to the left (in FIG. 2(B)) sufficiently to place the gap between them below the aperture 461. In other words, in this alternative embodiment, the Y-blinds 432a, 432b when fully closed still have a gap between them, as shown, but the gap is positioned farther to the left (beneath the aperture 461) than shown in FIG. 2(B), thereby providing a passage for the gas 460 from the aperture 461 through the aperture 470 into the downstream chamber 468.

Figure 6:
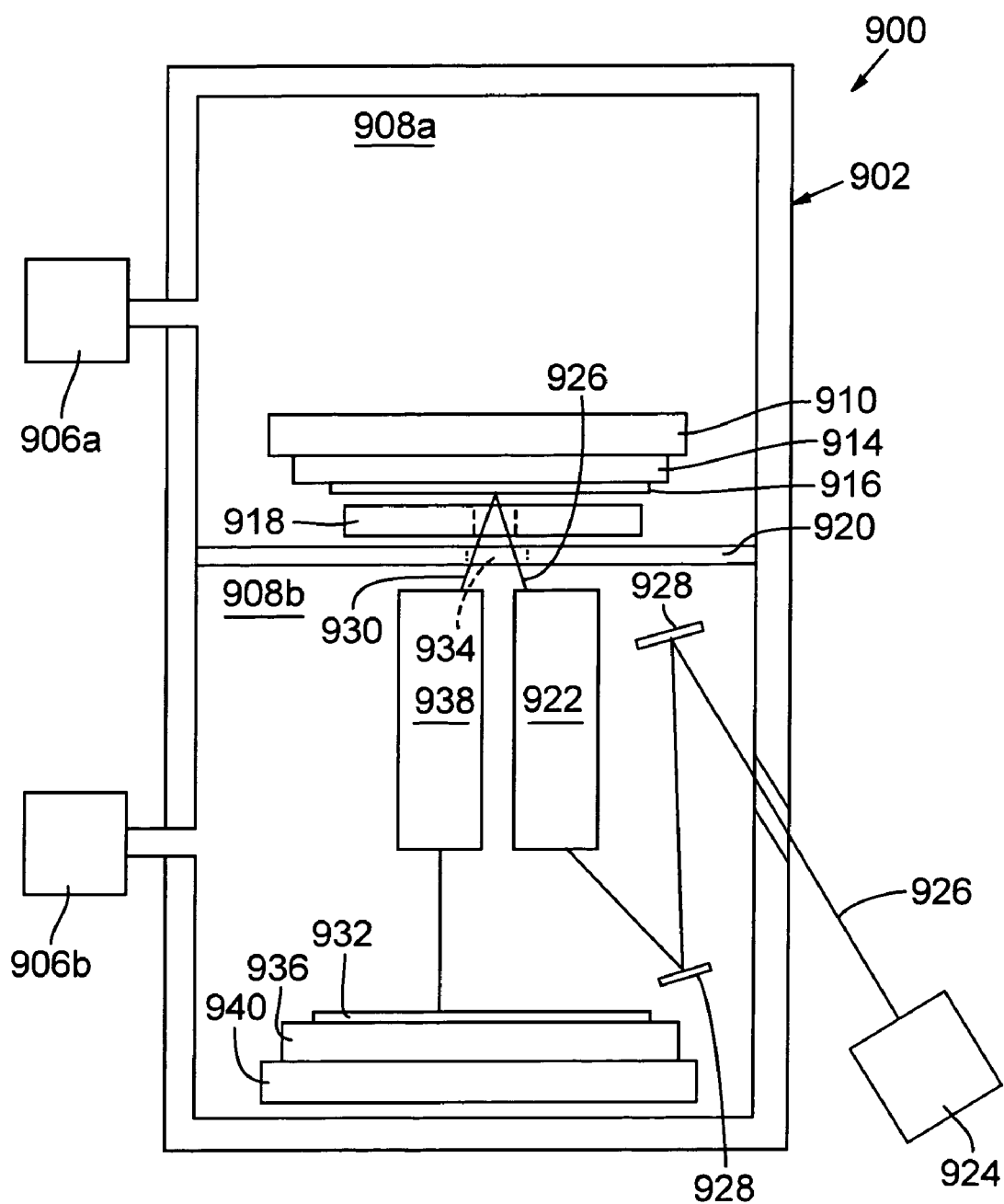
FIG. 6 is a schematic elevational view of an EUV lithography system including a blind apparatus as disclosed herein.

Referring now to FIG. 6, an embodiment of an EUVL system 900 is shown. The depicted system 900 comprises a vacuum chamber 902 including vacuum pumps 906a, 906b that are arranged to enable desired vacuum levels to be established and maintained within respective chambers 908a, 908b of the vacuum chamber 902. For example, the vacuum pump 906a maintains a vacuum level of approximately 50 mTorr in the upper chamber (reticle chamber) 908a, and the vacuum pump 906b maintains a vacuum level of less than approximately 1 mTorr in the lower chamber (optical chamber) 908b. The two chambers 908a, 908b are separated from each other by a barrier wall 920. Various components of the EUVL system 900 are not shown, for ease of discussion, although it will be appreciated that the EUVL system 900 can include components such as a reaction frame, a vibration-isolation mechanism, various actuators, and various controllers.

An EUV reticle 916 is held by a reticle chuck 914 coupled to a reticle stage 910. The reticle stage 910 holds the reticle 916 and allows the reticle to be moved laterally in a scanning manner, for example, during use of the reticle for making lithographic exposures. Between the reticle 916 and the barrier wall 920 is a blind apparatus such as that shown in FIGS. 2(A)-2(B). An illumination source 924 produces an EUV illumination beam 926 that enters the optical chamber 908b and reflects from one or more mirrors 928 and through an illumination-optical system 922 to illuminate a desired location on the reticle 916. As the illumination beam 926 reflects from the reticle 916, the beam is "patterned" by the pattern portion actually being illuminated on the reticle. The barrier wall 920 serves as a differential-pressure barrier and can serve as a reticle shield that protects the reticle 916 from particulate contamination during use. The barrier wall 920 defines an aperture 934 through which the illumination beam 926 may illuminate the desired region of the reticle 916. The incident illumination beam 926 on the reticle 916 becomes patterned by interaction with pattern-defining elements on the reticle, and the resulting patterned beam 930 propagates generally downward through a projection-optical system 938 onto the surface of a wafer 932 held by a wafer chuck 936 on a wafer stage 940 that performs scanning motions of the wafer during exposure. Hence, images of the reticle pattern are projected onto the wafer 932.

The wafer stage 940 can include (not detailed) a positioning stage that may be driven by a planar motor or one or more linear motors, for example, and a wafer table that is magnetically coupled to the positioning stage using an EI-core actuator, for example. The wafer chuck 936 is coupled to the wafer table, and may be levitated relative to the wafer table by one or more voice-coil motors, for example. If the positioning stage is driven by a planar motor, the planar motor typically utilizes respective electromagnetic forces generated by magnets and corresponding armature coils arranged in two dimensions. The positioning stage is configured to move in multiple degrees of freedom of motion, e.g., three to six degrees of freedom, to allow the wafer 932 to be positioned at a desired position and orientation relative to the projection-optical system 938 and the reticle 916.

An EUVL system including the above-described EUV-source and illumination-optical system can be constructed by assembling various assemblies and subsystems in a manner ensuring that prescribed standards of mechanical accuracy, electrical accuracy, and optical accuracy are met and maintained. To establish these standards before, during, and after assembly, various subsystems (especially the illumination-optical system 922 and projection-optical system 938) are assessed and adjusted as required to achieve the specified accuracy standards. Similar assessments and adjustments are performed as required of the mechanical and electrical subsystems and assemblies. Assembly of the various subsystems and assemblies includes the creation of optical and mechanical interfaces, electrical interconnections, and plumbing interconnections as required between assemblies and subsystems. After assembling the EUVL system, further assessments, calibrations, and adjustments are made as required to ensure attainment of specified system accuracy and precision of operation. To maintain certain standards of cleanliness and avoidance of contamination, the EUVL system (as well as certain subsystems and assemblies of the system) are assembled in a clean room or the like in which particulate contamination, temperature, and humidity are controlled.

Figure 7:
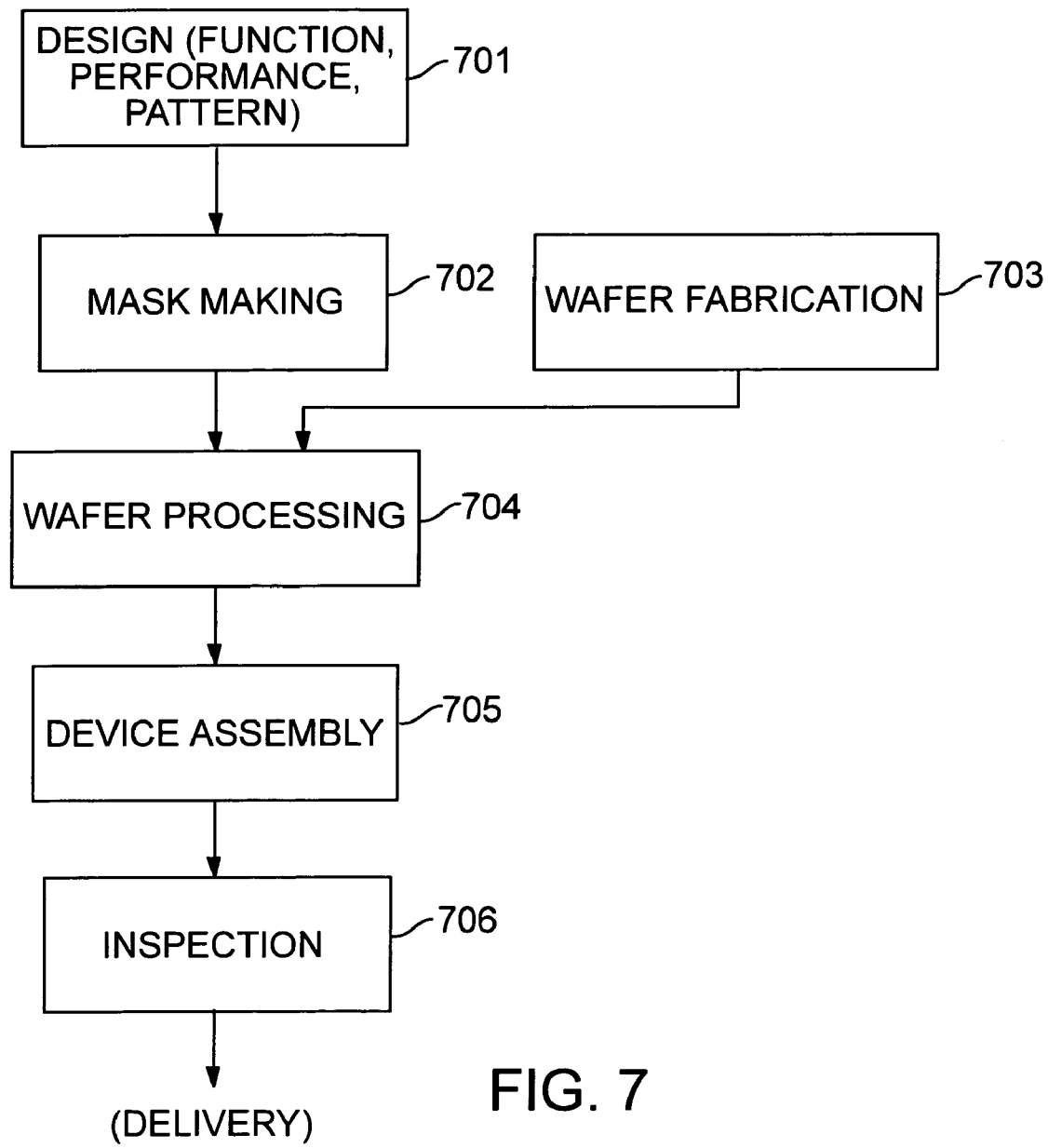
FIG. 7 is a process-flow diagram illustrating exemplary steps associated with a process for fabricating semiconductor devices.

Semiconductor devices can be fabricated by processes including microlithography steps performed using a microlithography system as described above. Referring to FIG. 7, in step 701 the function and performance characteristics of the semiconductor device are designed. In step 702 a reticle ("mask") defining the desired pattern is designed and fabricated according to the previous design step. Meanwhile, in step 703, a substrate (wafer) is fabricated and coated with a suitable resist. In step 704 ("wafer processing") the reticle pattern designed in step 702 is exposed onto the surface of the substrate using the microlithography system. In step 705 the semiconductor device is assembled (including "dicing" by which individual devices or "chips" are cut from the wafer, "bonding" by which wires are bonded to particular locations on the chips, and "packaging" by which the devices are enclosed in appropriate packages for use). In step 706 the assembled devices are tested and inspected.

Figure 8:
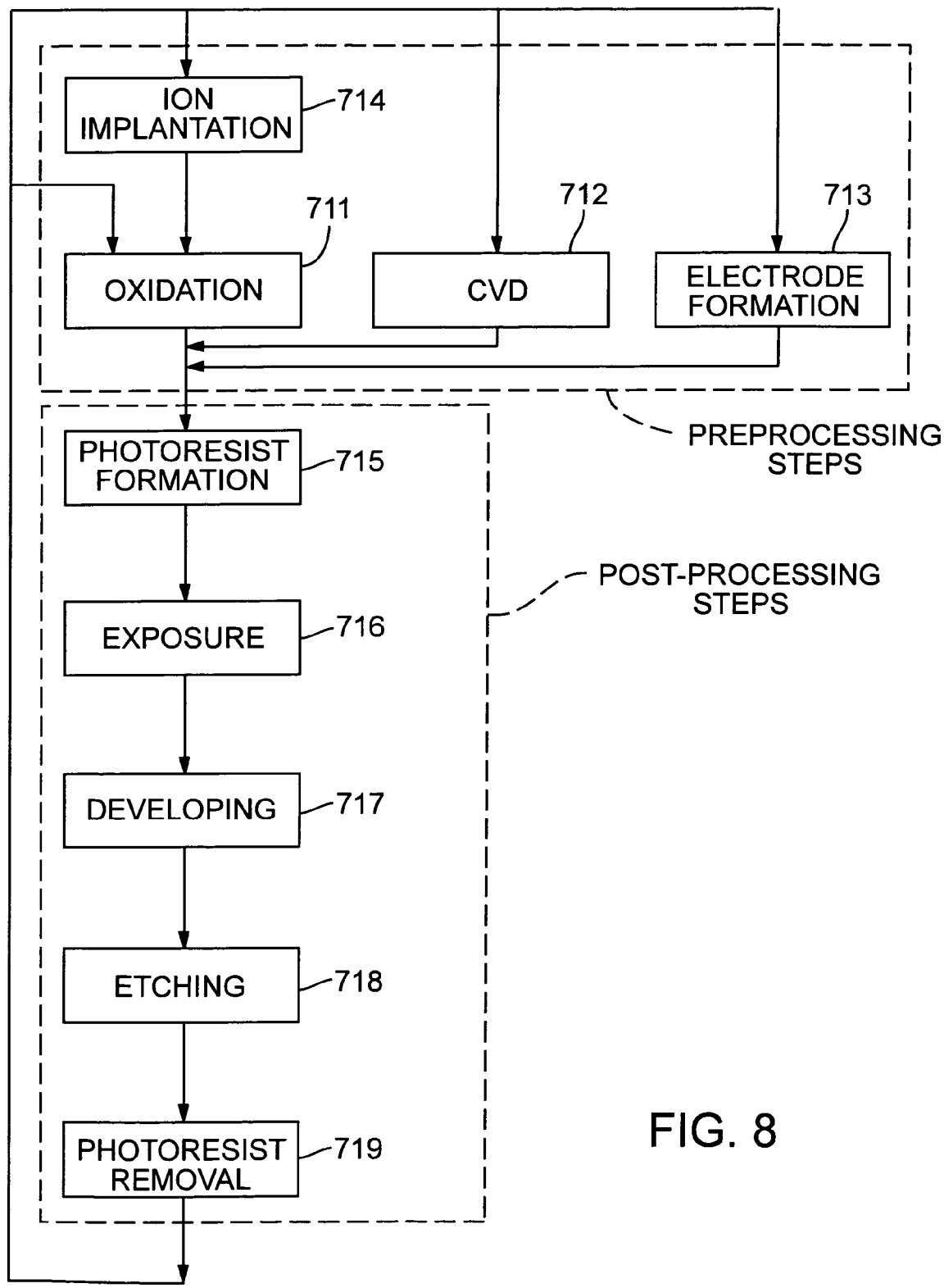
FIG. 8 is a process-flow diagram illustrating exemplary steps associated with processing a substrate (wafer), as would be performed, for example, in step 704 in FIG. 7.
Figure 9:
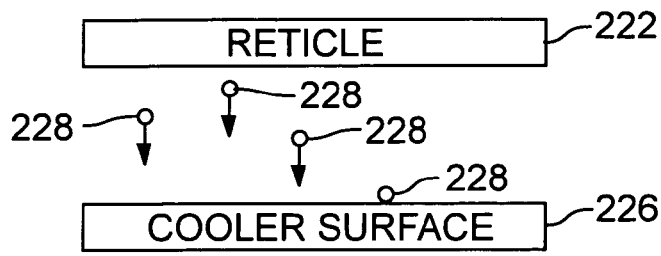
FIG. 9 is a schematic diagram showing general principles of thermophoresis.
Figure 10:
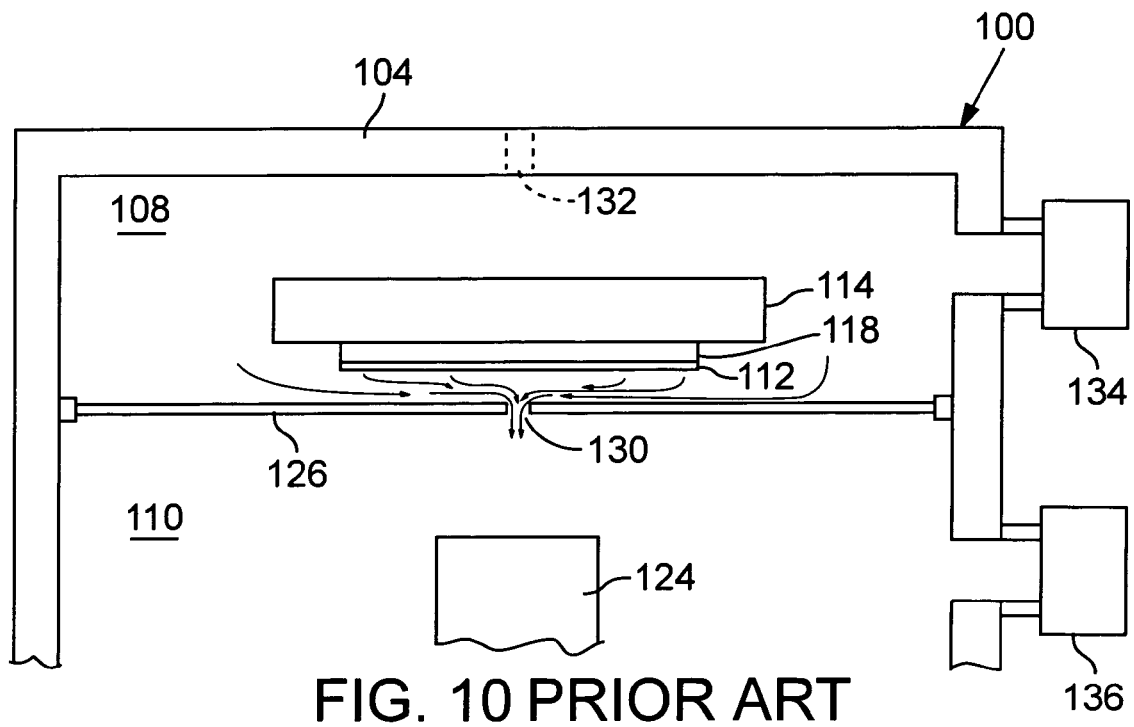
FIG. 10 is a schematic elevational view of a portion of an EUV lithography system that exploits thermophoresis for protecting the reticle according to one manner as known in the art.
Figure 11:
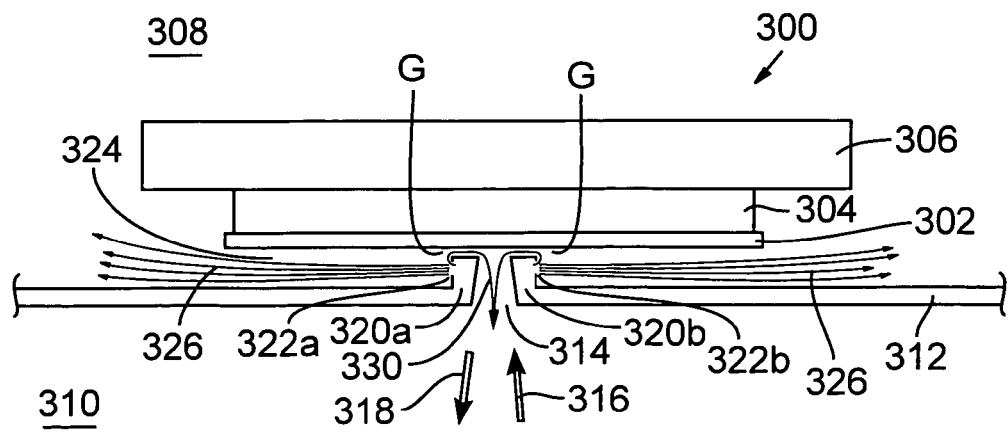
FIG. 11 is a schematic elevational view in the vicinity of a reticle stage of an EUV lithography system that exploits thermophoresis for protecting the reticle according to another manner as known in the art.

Representative details of a wafer-processing process including a microlithography step are shown in FIG. 8. In step 711 ("oxidation") the wafer surface is oxidized. In step 712 ("CVD") an insulative layer is formed on the wafer surface by chemical-vapor deposition. In step 713 (electrode formation) electrodes are formed on the wafer surface by vapor deposition, for example. In step 714 ("ion implantation") ions are implanted in the wafer surface. These steps 711-714 constitute representative "pre-processing" steps for wafers, and selections are made at each step according to processing requirements.

At each stage of wafer processing, when the pre-processing steps have been completed, the following "post-processing" steps are implemented. A first post-process step is step 715 ("photoresist formation") in which a suitable resist is applied to the surface of the wafer. Next, in step 716 ("exposure"), the microlithography system described above is used for lithographically transferring a pattern from the reticle to the resist layer on the wafer. In step 717 ("developing") the exposed resist on the wafer is developed to form a usable mask pattern, corresponding to the resist pattern, in the resist on the wafer. In step 718 ("etching"), regions not covered by developed resist (i.e., exposed material surfaces) are etched away to a controlled depth. In step 719 ("photoresist removal"), residual developed resist is removed ("stripped") from the wafer.

Formation of multiple interconnected layers of circuit patterns on the wafer is achieved by repeating the pre-processing and post-processing steps as required. Generally, a set of pre-processing and post-processing steps are conducted to form each layer.

It will be apparent to persons of ordinary skill in the relevant art that various modifications and variations can be made in the system configurations described above, in materials, and in construction without departing from the spirit and scope of this disclosure.

What is claimed is:

1. A lithography system, comprising:
a vacuum chamber comprising a first chamber portion and a second chamber portion;
a member situated between the first and second chambers and defining an exposure aperture;
a reticle stage situated in the first chamber portion and configured to hold a reticle movably relative to the exposure aperture;
a gas-discharge port situated and configured to deliver a gas with a temperature gradient into the first chamber portion so as to establish a thermophoretic condition with respect to at least a portion of the reticle;
a fixed-blind-aperture assembly that is movable relative to the exposure aperture and the reticle to an exposure position and to a non-exposure position, the fixed-blind-aperture assembly defining an illumination aperture through which light from the second chamber portion and gas from the first chamber portion can pass through the exposure aperture when the fixed-blind-aperture is in the exposure position; and
a gas-passage aperture displaced from the exposure aperture so as to conduct the gas, passing through the illumination aperture, from the first chamber portion to the second chamber portion when the fixed-blind-aperture assembly is in the non-exposure position.

2. The system of claim 1, wherein the gas-passage aperture is defined in the member.

3. The system of claim 1, wherein:
the fixed-blind-aperture assembly is situated in the first chamber portion between the member and the reticle and is separated from the reticle by a gap; and
the gas flows through the gap from first chamber portion through the exposure aperture to the second chamber portion when the fixed-blind-aperture assembly is in the exposure position, and flows through the gap from the first chamber portion through the gas-passage aperture to the second chamber portion when the fixed-blind-aperture assembly is in the non-exposure position.

4. The system of claim 1, wherein the fixed-blind-aperture assembly comprises the gas-discharge port.

5. The system of claim 4, wherein:
the gas-passage aperture is defined in the member; and
the member further comprises a collar extending around the gas-passage aperture and toward the moving blind so as to form at least a partial seal for passage of gas through the respective apertures in the moving blind and member when the fixed-blind-aperture assembly is in the non-exposure position.

6. The system of claim 4, wherein:
the moving blind comprises first and second blind portions that are movable relative to each other;
at least one of the first and second blind portions is movable to cover the exposure aperture when the fixed-blind-aperture assembly is in the non-exposure position; and
the first and second blind portions are situated, when the fixed-blind-aperture assembly is in the non-exposure position and the at least one blind portion is covering the exposure aperture, relative to each other to form a gas-passage gap between them, the gas-passage gap being situated so as to conduct, when the at least one moving blind is covering the exposure aperture and the fixed-blind-aperture is in the non-exposure position, the gas passing through the illumination aperture from the first chamber portion to the second chamber portion.

7. The system of claim 1, further comprising at least one moving blind situated between the fixed-blind-aperture assembly and the member and configured to move so as to cover the exposure aperture at selected times.

8. The system of claim 7, wherein:
the moving blind is movable to cover the exposure aperture whenever the fixed-blind-aperture assembly is in the non-exposure position; and
the moving blind defines an aperture situated so as to conduct, when the moving blind is covering the exposure aperture and the fixed-blind-aperture is in the non-exposure position, gas that has passed from the first chamber portion through the illumination aperture to the gas-passage aperture.

9. The system of claim 8, wherein the gas-passage aperture and the aperture in the moving blind are aligned with each other when the moving blind is covering the exposure aperture and the fixed-blind-aperture assembly is in the non-exposure position.

10. The system of claim 7, wherein;
the reticle extends and the reticle stage is configured to move the reticle in an X-direction and in a Y-direction;
the moving blind comprises a moving X-blind and a moving Y-blind; and
the aperture in the moving blind is defined in at least one of the X-blind and Y-blind.

11. The system of claim 1, wherein the fixed-blind-aperture assembly is configured such that, whenever it is in the non-exposure position, a space is provided between the exposure aperture and the reticle, in which space a measurement is performed of reticle position using at least one laser beam directed to and incident on the reticle at an oblique angle.

12. The system of claim 11, wherein the measurement pertains to a reticle-autofocus measurement performed using an array of multiple laser beams directed to and incident on the reticle.

13. The system of claim 1, further comprising at least one of an illumination-optical system, a projection-optical system, and a wafer stage contained in the second chamber portion.

14. The system of claim 1, wherein the light passing from the second chamber portion through the exposure aperture and the fixed-blind aperture comprises a beam of extreme UV light.

15. A microlithography method, performed using a lithography system as recited in claim 1.

16. The microlithography method of claim 15, wherein the light passing from the second chamber portion through the exposure aperture and the fixed-blind aperture comprises a beam of extreme UV light.

17. A lithography system, comprising:
chamber means;
dividing means for dividing the chamber means into a first chamber portion and a second chamber portion and for defining an exposure aperture by which light passes from the second chamber portion to the first chamber portion and from the first chamber portion to the second chamber portion;

reticle-stage means for holding a reticle, in the first chamber portion, movably relative to the exposure aperture so as to allow the reticle to receive light from the second chamber portion and to reflect the light to the second chamber portion;

gas-introduction means for introducing a gas with a temperature gradient into the first chamber portion relative to the reticle; and fixed-blind-aperture means for defining a fixed-blind illumination aperture and for moving the illumination aperture, relative to the exposure aperture and the reticle, to an exposure position and to a non-exposure position, wherein light from the second chamber portion and the gas from the first chamber portion pass through the exposure aperture whenever the fixed-blind-aperture means is in the exposure position;

the dividing means further defining gas-passage means for conducting the gas, passing through the illumination aperture, from the first chamber portion to the second chamber portion when the fixed-blind-aperture means is in the non-exposure position.

18. The system of claim 17, wherein the gas-passage means does not pass significant amounts of the gas when the fixed-blind-aperture means is in the exposure position.

19. The system of claim 17, further comprising moving-blind means for substantially blocking the exposure aperture to passage of light and gas whenever the moving-blind means is in a closed condition, and allowing passage of light through the exposure aperture whenever the moving-blind means is in an open condition.

20. The system of claim 19, wherein the moving-blind means comprises at least one moving blind defining an aperture that, when the moving blind is in an open condition, allows passage therethrough of gas passing through the illumination aperture to the gas-passage means.

21. The system of claim 20, wherein the moving blind defines collar means extending around the aperture and toward the illumination aperture to provide seal means for gas passing from the illumination aperture to the gas-passage means.

22. The system of claim 17, further comprising at least one of an illumination means, a projection means, and a wafer-stage means located in the second chamber portion.

23. The system of claim 17, further comprising means for establishing a higher vacuum in the second chamber portion than in the first chamber portion.

24. The system of claim 17, further comprising means for establishing a controlled bleed of pressure from the first chamber portion to the second chamber portion.

25. The system of claim 17, wherein the light passing from the second chamber portion to the first chamber portion comprises a beam of extreme UV light.

26. A microlithography method, performed using a lithography system as recited in claim 17.

27. The microlithography method of claim 26, wherein the light passing from the second chamber portion to the first chamber portion comprises a beam of extreme UV light.

28. A lithography system, comprising:
a vacuum chamber comprising a first chamber portion and a second chamber portion separated from the first chamber portion by a barrier plate defining an exposure aperture;
a reticle stage situated in the first chamber portion and configured to hold a reticle movably relative to the exposure aperture; and
a fixed-blind-aperture assembly situated in the first chamber portion between the reticle and the barrier plate and separated from the reticle by a gap, the fixed-blind-aperture assembly being movable relative to the exposure aperture and the reticle to an exposure position and a non-exposure position, the fixed-blind-aperture assembly comprising a nozzle manifold configured to flow a gas with a temperature gradient into the first chamber portion relative to the reticle sufficiently to establish a thermophoretic condition with respect to at least a portion of the reticle, the fixed-blind-aperture assembly defining an illumination aperture through which illumination light from the second chamber portion, patterned light from the first chamber portion, and gas passing through the gap from the first chamber portion can pass through the exposure aperture when the fixed-blind-aperture is in the exposure position;
the barrier member defining a gas-passage aperture separate from the exposure aperture, the gas-passage aperture being situated so as to conduct the gas passing through the illumination aperture from the first chamber portion to the second chamber portion when the fixed-blind-aperture assembly is in the non-exposure position.

29. The system of claim 28, further comprising a moving X-blind and a moving Y-blind situated between the fixed-blind-aperture assembly and the barrier plate, the X-blind and Y-blind being cooperatively movable to allow, at selected times when the fixed-blind-aperture assembly is in the exposure position, passage of light and gas through the exposure aperture and to block, at selected times when the fixed-blind-aperture assembly is in the non-exposure position, passage of significant amounts of light and gas through the exposure aperture.

30. The system of claim 28, wherein the non-exposure position defines a space, between the exposure aperture and the reticle, suitable for performing a measurement of reticle position using at least one laser beam directed to and incident on the reticle at a grazing angle of incidence.

31. The system of claim 30, wherein the measurement pertains to a reticle-autofocus measurement performed using an array of multiple laser beams directed to and incident on the reticle.

32. The system of claim 28, wherein the illumination light comprises a beam of extreme UV light.

33. A microlithography method, performed using a lithography system as recited in claim 28.

34. The microlithography method of claim 33, wherein the illumination light comprises a beam of extreme UV light.

35. In a lithography system comprising a vacuum chamber including a barrier member separating the vacuum chamber into first and second chamber portions and defining an exposure aperture by which the chamber portions communicate with each other; a reticle stage mounted in the first chamber portion and configured to hold a reticle movably relative to the exposure aperture; and a fixed-blind-aperture assembly, providing a gas flow with a temperature gradient, that is movable relative to the reticle to an exposure position and to a non-exposure position, the fixed-blind-aperture assembly being separated from the reticle by a gap for passage of gas from the vacuum chamber past the reticle and defining an illumination aperture through which illumination light and gas can pass through the exposure aperture whenever the fixed-blind-aperture assembly is in the exposure position, an improvement, comprising:
a gas aperture defined in the barrier member at a location allowing passage of the gas from the first chamber portion through the gap and through the illumination aperture whenever the fixed-blind-aperture assembly is in the non-exposure position.

36. The system of claim 35, further comprising at least one movable blind configured to cover the exposure aperture at selected times including when the fixed-blind-aperture assembly is in the non-exposure position.

37. The system of claim 36, wherein the movable blind defines a gas aperture situated at a location allowing passage of the gas from the first chamber portion through the gap, illumination aperture, and gas aperture in the barrier member whenever the fixed-blind-aperture assembly is in the non-exposure position.

38. The system of claim 35, wherein the illumination light comprises a beam of extreme UV light.

39. A microlithography method, performed using a lithography system as recited in claim 35.

40. The microlithography method of claim 39, wherein the illumination light comprises a beam of extreme UV light.

41. In a lithographic method in which a pattern-defining reticle is irradiated by an illumination beam that reflects from the reticle to form a patterned beam, wherein the reticle is mounted inside a first chamber in which a surface of the reticle is irradiated by the illumination beam propagating from a second chamber through an exposure aperture and fixed-blind aperture to the reticle surface to produce a patterned beam that reflects back through the exposure aperture and fixed-blind aperture to the second chamber, a method for reducing particulate contamination of the reticle surface, comprising:
  flowing a gas with a temperature gradient into the first chamber such that the gas contacts the reticle surface and establishes a thermophoretic condition with respect to the reticle surface;
  for actual irradiation of a region of the reticle surface, moving the fixed-blind aperture to an exposure position at which the illumination beam can pass through the exposure aperture and the fixed-blind aperture to the region while allowing a flow of a portion of the gas through the fixed-blind aperture and exposure aperture to the second chamber, the gas flow thereby establishing a protection condition with respect to the irradiated region of the reticle surface in addition to other regions of the reticle surface, the protection condition serving to reduce particulate contamination of the reticle surface;
  during a time when the reticle is not being irradiated, moving the fixed-blind aperture to a non-exposure position while maintaining the flow of the portion of gas through the fixed-blind aperture, at the non-exposure position, to the second chamber.

42. The method of claim 41, wherein the flow of the portion of gas through the fixed-blind aperture at the non-exposure position is maintained by passing the gas flow, after passing through the fixed-blind aperture, through an aperture separate from the exposure aperture.

43. The method of claim 42, further comprising the step, during the time when the reticle is not being irradiated, of blocking the exposure aperture.

44. The method of claim 43, wherein the exposure aperture is blocked using a movable blind.

45. The method of claim 44, wherein the flow of the portion of gas through the fixed-blind aperture at the non-exposure position is maintained further by passing the gas flow, after passing through the fixed-blind aperture, through a gas-passage aperture defined in the movable blind, then through the aperture that is separate from the exposure aperture.

46. The method of claim 41, further comprising the step, during the time when the fixed-blind aperture is at the non-exposure position, of measuring an autofocus position of the reticle.

47. The method of claim 46, wherein the step of measuring an autofocus position of the reticle comprises directing an array of multiple laser beams to be incident at respective locations on the reticle and detecting corresponding beams reflected from the reticle.

48. The method of claim 41, wherein the illumination beam comprises a beam of extreme UV light.

* * * * *